(12) United States Patent
Hwang et al.

(10) Patent No.: US 11,887,968 B2
(45) Date of Patent: Jan. 30, 2024

(54) METHOD OF MANUFACTURING A SEMICONDUCTOR PACKAGE

(71) Applicant: SAMSUNG ELECTRONICS CO., LTD., Suwon-si (KR)

(72) Inventors: Ji Hwan Hwang, Hwaseong-si (KR); Ji Hoon Kim, Asan-si (KR); Ji Seok Hong, Yongin-si (KR); Tae Hun Kim, Asan-si (KR); Hyuek Jae Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/493,975

(22) Filed: Oct. 5, 2021

(65) Prior Publication Data

US 2022/0028837 A1 Jan. 27, 2022

Related U.S. Application Data

(63) Continuation of application No. 16/589,541, filed on Oct. 1, 2019, now Pat. No. 11,145,626.

(30) Foreign Application Priority Data

Oct. 24, 2018 (KR) .................. 10-2018-0127518

(51) Int. Cl.
*H01L 25/065* (2023.01)
*H01L 23/48* (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
CPC ........... H01L 25/0657; H01L 21/76898; H01L 23/481; H01L 24/08; H01L 24/80;
(Continued)

(56) References Cited

U.S. PATENT DOCUMENTS 8,293,578 B2 * 10/2012 Bartley .................. H01L 25/50
438/458
8,373,261 B2 * 2/2013 Kim ...................... H01L 21/561
257/723
(Continued)

OTHER PUBLICATIONS

Korean Office Action dated Nov. 14, 2022 for corresponding application, KR 10-2018- 0127518.

*Primary Examiner* — Mohammed Shamsuzzaman
(74) *Attorney, Agent, or Firm* — Muir Patent Law, PLLC

(57) ABSTRACT

A semiconductor package includes a base structure having a base pad, a first semiconductor chip on the base structure, and having a first connection pad bonded to the base pad, a first bonding structure including an base insulation layer of a base structure and a first lower insulation layer of the first semiconductor chip bonded to the base insulation layer, a second semiconductor chip on the first semiconductor chip, and having a second connection pad connected to the first through-electrode, and a second bonding structure including a first upper insulation layer of the first semiconductor chip, and a second lower insulation layer of the second semiconductor chip bonded to the first upper insulation layer, and the first upper insulation layer has a dummy insulation portion extending onto the base structure around the first semiconductor chip.

12 Claims, 19 Drawing Sheets

(51) Int. Cl.
  *H01L 21/768* (2006.01)
  *H01L 25/00* (2006.01)
  *H01L 23/00* (2006.01)
(52) U.S. Cl.
  CPC ............. *H01L 24/08* (2013.01); *H01L 24/80* (2013.01); *H01L 25/50* (2013.01); *H01L 2224/08146* (2013.01); *H01L 2224/80895* (2013.01); *H01L 2224/80896* (2013.01); *H01L 2225/06524* (2013.01); *H01L 2225/06541* (2013.01); *H01L 2225/06586* (2013.01)
(58) Field of Classification Search
  CPC ........... H01L 25/50; H01L 2224/08146; H01L 2224/80895; H01L 2224/80896; H01L 2225/06524; H01L 2225/06541; H01L 2225/06586; H01L 2224/0557; H01L 2224/08145; H01L 21/561; H01L 23/3128; H01L 23/36; H01L 24/96; H01L 2224/05009; H01L 24/09; H01L 24/92; H01L 24/05; H01L 2224/05647; H01L 2224/08058; H01L 2224/08237; H01L 2224/16227; H01L 2224/29194; H01L 2224/2929; H01L 2224/29299; H01L 2224/32245; H01L 2224/73251; H01L 2224/80203; H01L 2224/8083; H01L 2224/9202; H01L 2224/96; H01L 2224/97; H01L 2224/09181; H01L 2224/8034; H01L 2225/06527; H01L 25/18; H01L 23/49816; H01L 23/49833; H01L 25/071; H01L 23/31; H01L 23/485; H01L 24/06
  See application file for complete search history.

(56) References Cited

U.S. PATENT DOCUMENTS

| | | | |
|---|---|---|---|
| 8,860,229 B1* | 10/2014 | Lin ..................... | H01L 25/0657 257/774 |
| 8,937,309 B2* | 1/2015 | England ................ | H01L 23/544 257/48 |
| 9,000,599 B2* | 4/2015 | Raorane ............ | H01L 23/49822 438/109 |
| 9,030,009 B2* | 5/2015 | Moon .................... | H01L 24/94 257/737 |
| 9,711,494 B2* | 7/2017 | England .................. | H01L 24/96 |
| 9,953,941 B2 | 4/2018 | Enquist et al. | |
| 10,026,716 B2 | 7/2018 | Yu et al. | |
| 10,886,255 B2* | 1/2021 | Hong ...................... | H01L 24/80 |
| 2013/0037802 A1* | 2/2013 | England ............. | H01L 25/0657 257/E23.179 |
| 2014/0353815 A1* | 12/2014 | England ................ | H01L 23/481 257/777 |
| 2015/0221517 A1* | 8/2015 | Kim .................... | H01L 21/6836 438/460 |
| 2017/0301650 A1* | 10/2017 | Yu ....................... | H01L 25/0657 |
| 2018/0158749 A1 | 6/2018 | Yu et al. | |
| 2018/0294212 A1 | 10/2018 | Chen et al. | |
| 2019/0363068 A1* | 11/2019 | Hotta ...................... | H01L 24/80 |
| 2020/0135594 A1* | 4/2020 | Lee ...................... | H01L 23/5283 |
| 2020/0284282 A1* | 9/2020 | Ueshima ................ | B23K 1/203 |

* cited by examiner

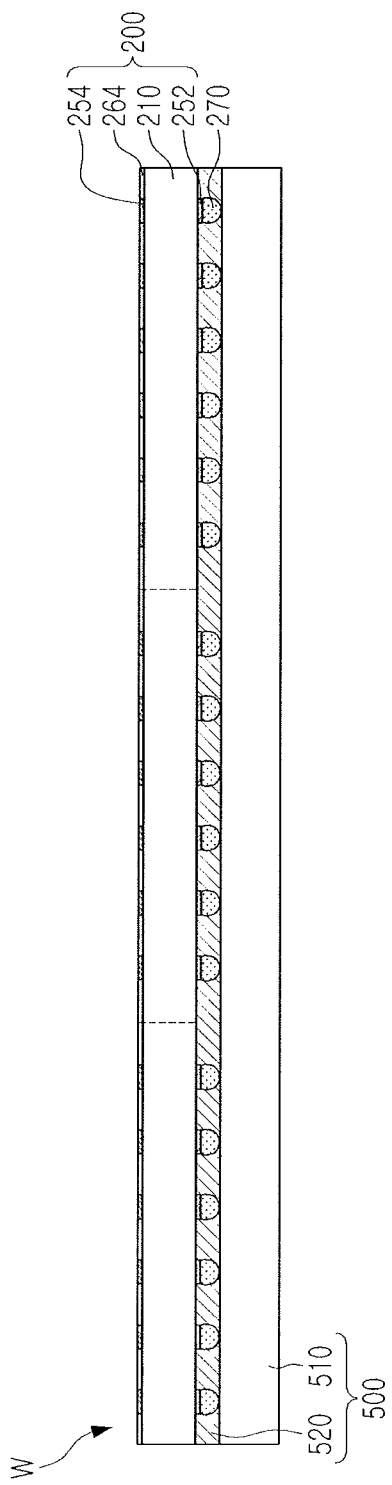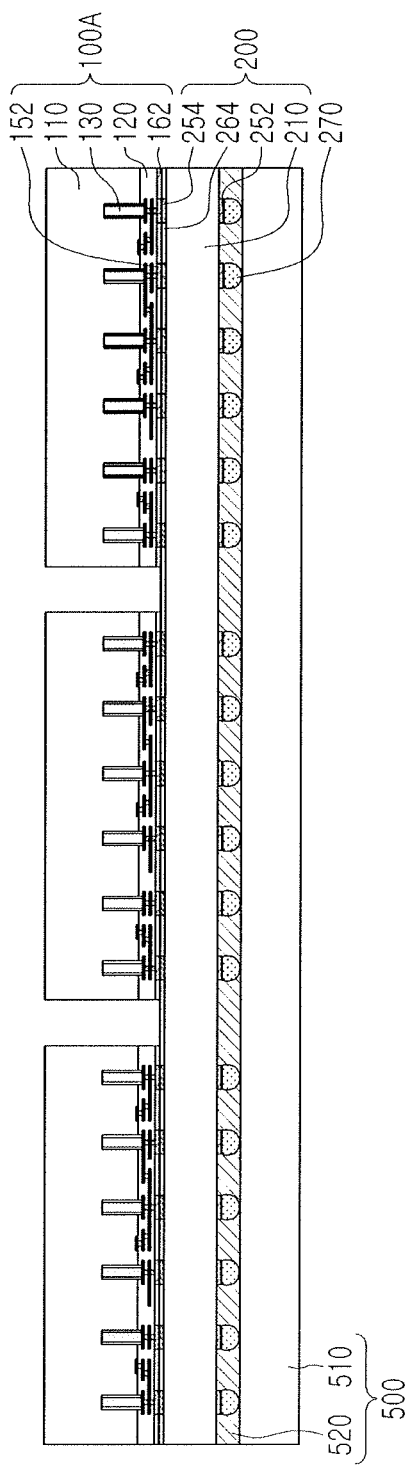

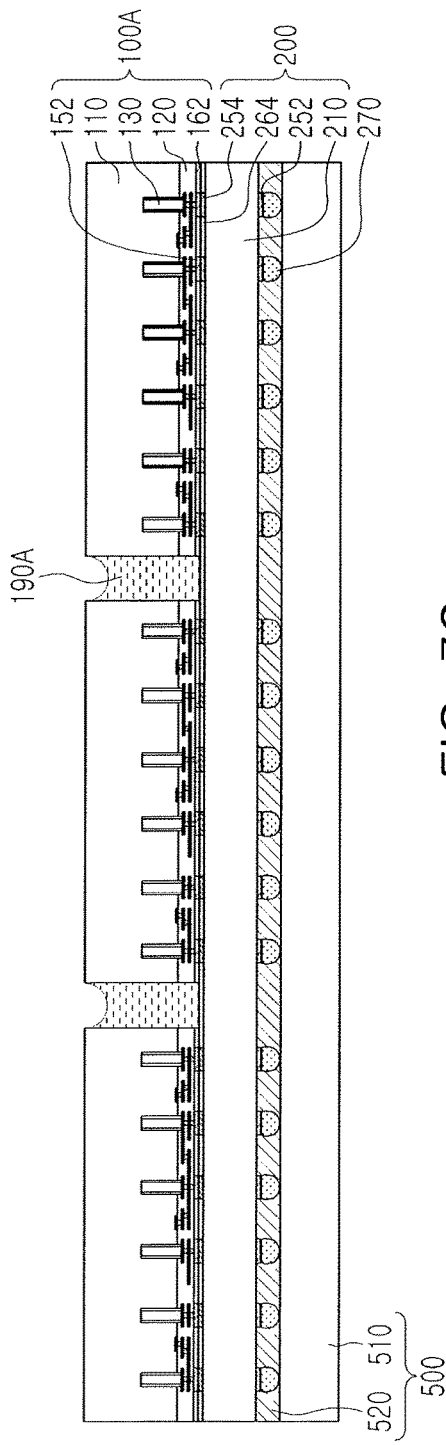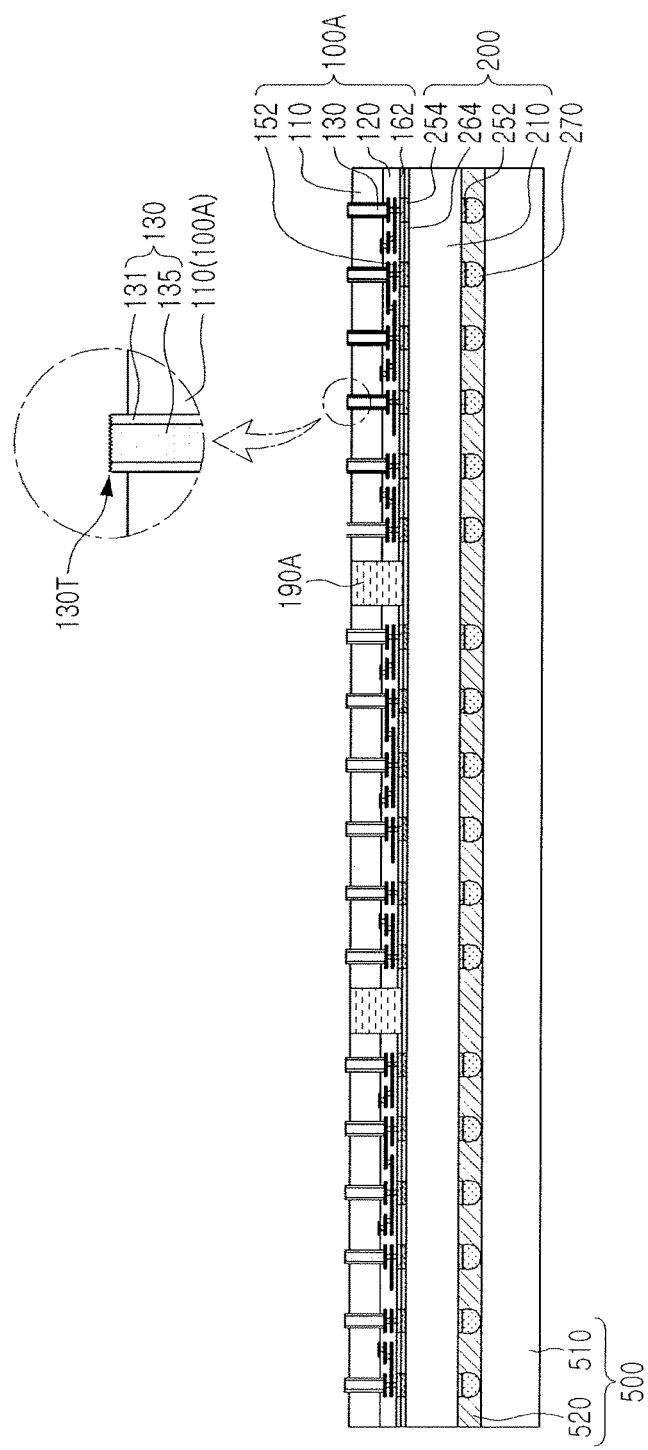
FIG. 7C
FIG. 7D

METHOD OF MANUFACTURING A SEMICONDUCTOR PACKAGE

CROSS-REFERENCE TO RELATED APPLICATIONS

This is a continuation application based on pending U.S. application Ser. No. 16/589,541, filed on Oct. 1, 2019, the entire contents of which is hereby incorporated by reference.

This application claims priority under 35. U.S.C. § 119 to Korean Patent Application No. 10-2018-0127518, filed on Oct. 24, 2018, in the Korean Intellectual Property Office, and entitled "SEMICONDUCTOR PACKAGE," the disclosure of which is incorporated by reference herein in its entirety.

BACKGROUND

1. Field

Embodiments relate to a semiconductor package.

2. Description of the Related Art

Electronic devices are becoming smaller and lighter in accordance with the development of the electronics industry and users' demand, and thus, semiconductor packages used in the electronic devices are required to have relatively high performance and relatively high capacity, along with miniaturization and weight reduction.

SUMMARY

Embodiments are directed to a semiconductor package that includes a base structure having a lower surface and an upper surface and having a connection terminal on the lower surface, and a base pad on the upper surface, a first semiconductor chip stacked on the upper surface of the base structure and having a first connection pad directly bonded to the base pad and a first through-electrode connected to the first connection pad, a first bonding structure disposed between the base structure and the first semiconductor chip, the first bonding structure including an base insulation layer on the upper surface of a base structure, and a first lower insulation layer on the first semiconductor chip, the first lower insulation layer directly bonded to the base insulation layer, a second semiconductor chip stacked on the first semiconductor chip, and having a second connection pad connected to the first through-electrode, and a second bonding structure disposed between the first semiconductor chip and the second semiconductor chip, the second bonding structure including a first upper insulation layer on the first semiconductor chip, and a second lower insulation layer on the second semiconductor chip, the second lower insulation layer directly bonded to the first upper insulation layer, the first upper insulation layer having a dummy insulation portion extending onto the base structure around the first semiconductor chip.

Embodiments are also directed to a semiconductor package that includes a base structure having a lower surface and an upper surface, and having a connection terminal on the lower surface, and a base pad and a base insulation layer on the upper surface, a first semiconductor chip stacked on the upper surface of the base structure, having a lower surface and an upper surface, and having a first connection pad and a first lower insulation layer on the lower surface, a first bonding pad and a first upper insulation layer on the upper surface, and a first through-electrode connected to the first connection pad and first bonding pad, the first connection pad directly bonded to the base pad, and the first lower insulation layer directly bonded to the base insulation layer, at least one second semiconductor chip stacked on the upper surface of the first semiconductor chip, having a lower surface and an upper surface, and having a second connection pad and a second lower insulation layer on the lower surface, a second bonding pad and a second upper insulation layer on the upper surface, and a second through-electrode connected to the second connection pad and second bonding pad, the second connection pad directly bonded to the first bonding pad, and the second lower insulation layer directly bonded to the first upper insulation layer, a third semiconductor chip stacked on the upper surface of the second semiconductor chip, having a lower surface and an upper surface, and having a third connection pad and a third lower insulation layer on the lower surface, the third connection pad directly bonded to the second bonding pad, and the third lower insulation layer directly bonded to the second upper insulation layer, a first dummy insulation portion on the base structure around the first semiconductor chip and extending from the first upper insulation layer, and a second dummy insulation portion on first dummy insulation portion and extending from the second upper insulation layer.

Embodiments are also directed to a semiconductor package that includes a base structure having a lower surface and an upper surface, and having a connection terminal on the lower surface, and a base pad and a base insulation layer on the upper surface, a first semiconductor chip stacked on the upper surface of the base structure, having a lower surface and an upper surface, and having a first connection pad and a first lower insulation layer on the lower surface, a first bonding pad and a first upper insulation layer on the upper surface, and a first through-electrode connected to the first connection pad and first bonding pad, the first connection pad directly bonded to the base pad, and the first lower insulation layer directly bonded to the base insulation layer, at least one second semiconductor chip stacked on the upper surface of the first semiconductor chip, having a lower surface and an upper surface, and having a second connection pad and a second lower insulation layer on the lower surface, a second bonding pad and a second upper insulation layer on the upper surface, and a second through-electrode connected to the second connection pad and second bonding pad, the second connection pad directly bonded to the first bonding pad, and the second lower insulation layer directly bonded to the first upper insulation layer, a third semiconductor chip stacked on the upper surface of the second semiconductor chip, having a lower surface and an upper surface, and having a third connection pad and a third lower insulation layer on the lower surface, the third connection pad directly bonded to the second bonding pad, and the third lower insulation layer directly bonded to the second upper insulation layer, a first dummy insulation portion on the base structure around the first semiconductor chip and extending from the first upper insulation layer, and a second dummy insulation portion on first dummy insulation portion and extending from the second upper insulation layer.

BRIEF DESCRIPTION OF THE DRAWINGS

Features will become apparent to those of skill in the art by describing in detail example embodiments with reference to the attached drawings in which:

FIGS. 7A to 7H illustrate cross-sectional views of main processes of a method of manufacturing semiconductor package according to an example embodiment;

DETAILED DESCRIPTION

Figure 1:
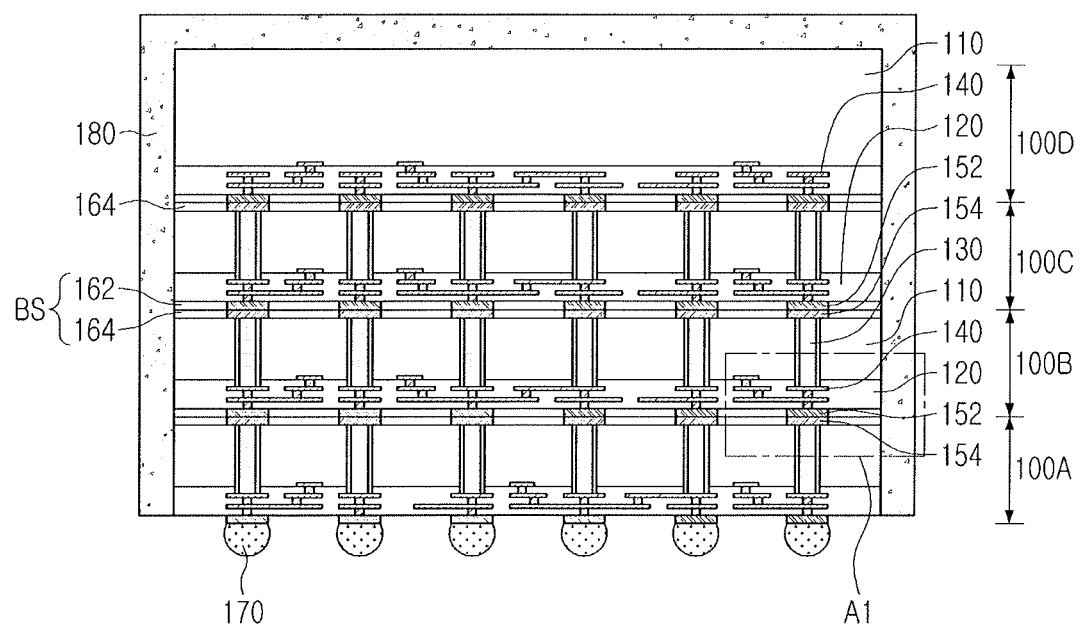
FIG. 1 illustrates a cross-sectional view of a semiconductor package according to an example embodiment.
Figure 2:
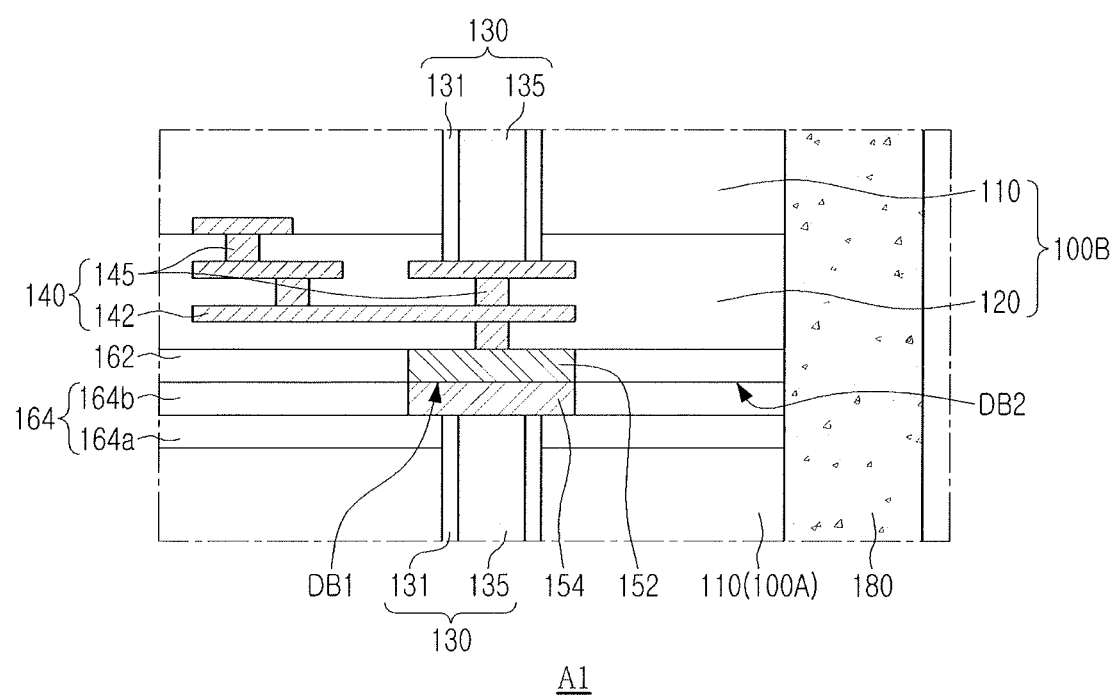
FIG. 2 illustrates an enlarged cross-sectional view of portion "A1" in FIG. 1.

FIG. 1 is a cross-sectional view illustrating a semiconductor package according to an example embodiment, and FIG. 2 is an enlarged cross-sectional view of portion "A1" in FIG. 1.

Referring to FIG. 1, a semiconductor package 300A may include a first semiconductor chip 100A, a second semiconductor chip 100B, a third semiconductor chip 100C, and a fourth semiconductor chip 100D, stacked in a vertical direction.

Each of the first to fourth semiconductor chips 100A, 100B, 100C, and 100D may have a lower surface (also referred to as a 'first surface') and an upper surface (or a 'second surface'), opposing each other, and may be stacked in a mutually stacked manner of the surfaces (i.e., the first surface and the second surface). The first to fourth semiconductor chips 100A, 100B, 100C, and 100D may include a semiconductor substrate 110, a semiconductor device layer 120, a through-electrode 130 (e.g., a through silicon via (TSV)), a connection pad 152, and a bonding pad 154. The semiconductor chip (for example, the fourth semiconductor chip 100D) disposed in an uppermost position may not include the through-electrode 130 and a bonding pad 154, as shown in FIG. 1.

Referring to FIGS. 1 and 2, a semiconductor device layer 120 may be on a lower surface of each semiconductor substrate 110. The semiconductor device layers 120 may each be formed to include a wiring structure 140 connecting a plurality of discrete elements to other wiring lines (for example, the through-electrode 130) of the semiconductor substrate 110. The wiring structure 140 may include a metal wiring layer 142 and a via 145. For example, the wiring structure 140 may be a multi-layer structure in which two or more metal wiring layers 142 and/or two or more vias 145 are alternately stacked. The wiring structure 140 may be connected to the connection pad 152 on the lower surfaces of the first to fourth semiconductor chips 100A, 100B, 100C, and 100D.

Each of the through-electrodes 130 may extend from the upper surface of the semiconductor substrate 110 toward the lower surface thereof, and may extend into the semiconductor device layer 120. At least a portion of the through-electrode 130 may have a pillar shape. The through-electrode 130 may include a via plug 135 and a lateral insulation film 131 surrounding the via plug 135. The lateral insulation film 131 may electrically isolate the via plug 135 from the semiconductor substrate 110 and the semiconductor device layer 120. As described above, the fourth semiconductor chip 100D disposed in the uppermost position may not include the through-electrode 130. The through-electrode 130 may be connected to the bonding pad 154 on the upper surfaces of the first to third semiconductor chips 100A, 100B, and 100C.

As described above, the through-electrode 130 may be connected to the wiring structure 140 to electrically connect the connection pads 152 of the first to third semiconductor chips 100A, 100B, and 100C and the bonding pads 154 of the first to third semiconductor chips 100A, 100B, and 100C.

The bonding pads 154 of the first to third semiconductor chips 100A, 100B, and 100C may be directly bonded to the connection pads 152 of the second to fourth semiconductor chips 100B, 100C, and 100D, respectively. For example, as illustrated in FIG. 2, the bonding pad 154 and the connection pad 152 between the neighboring first and second semiconductor chips 100A and 100B may be directly bonded to each other with direct contact therebetween to provide metal bonding. As a result, the first and second semiconductor chips 100A and 100B may be fixed together with an electrical connection between the first and second semiconductor chips 100A and 100B. In a similar manner to the above, the bonding pad 154 and the connection pad 152 between the second and third semiconductor chips and between the third and fourth semiconductor chips may be formed to provide metal bonding.

The bonding pad 154 and the connection pad 152 may include the same metal, for example, copper (Cu). The bonding pads 154 and the connection pads 152, in direct contact with each other, may be bonded to each other by mutual diffusion of copper through a high temperature annealing process. A metal forming the bonding pad 154 and the connection pad 152 may include other metals capable of being bonded to each other (for example, Au).

An electrical connection, as well as solid bonding of the stacked semiconductor chips, may be achieved through such metal bonding (without any separate connection bump). A path for transmitting and receiving at least one of a control signal, a power supply signal, a ground signal, and a data signal between the first to fourth semiconductor chips 100A, 100B, 100C, and 100D may be provided. Connection bumps such as solder may be omitted, and thus transmission loss may be relatively reduced.

The semiconductor package 300A according to the present example embodiment may include a bonding structure BS disposed between neighboring semiconductor chips. The bonding structure BS may include an upper insulation layer 164 on the upper surfaces of the first to third semiconductor chips 100A, 100B, and 100C, respectively, and a lower insulation layer 162 on the upper surfaces of the second to fourth semiconductor chips 100B, 100C, and 100D, respectively, and directly bonded (see DB2 in FIG. 2) to the upper insulation layer 164. The upper insulation layer 164 and the lower insulation layer 162 may be formed of the same material. For example, the upper insulation layer 164 and the lower insulation layer 162 may include silicon oxide. The direct bonding (DB2) of the upper insulation layer 164 and the lower insulation layer 162 may be performed by a high temperature annealing process in which the, for example, silicon oxide, surfaces of the upper insulation layer 164 and the lower insulation layer 162 are in direct contact with each other. The bonding structure (BS) may have a relatively high rigid bonding strength by covalent bonding. An insulating material forming the upper insulation layer 164 and the lower insulation layer 162 may be other materials capable of being bonded to each other (for example, SiCN).

As illustrated in FIG. 2, the upper insulation layer 164 employed in the present example embodiment may include a first upper insulation layer 164a and a second upper insulation layer 164b arranged on the upper surfaces of the first to third semiconductor chips 100A, 100B, and 100C in sequence. The through-electrode 130 may pass through the first upper insulation layer 164a, and have an upper surface substantially coplanar with an upper surface of the first upper insulation layer 164a. The bonding pad 154 may be formed on the first upper insulation layer 164a, and may be connected to the through-electrode 130. The first upper insulation layer 164a may be used as a passivation layer, and may help prevent undesirable electrical connections between the bonding pad 154 and the semiconductor substrate 110. In addition, the first bonding pad 154 may be embedded in the second upper insulation layer 164b such that the upper surface of the first bonding pad 154 is exposed. The first bonding pad 154 may have an upper surface substantially coplanar with an upper surface of the second upper insulation layer 164b.

The first and second upper insulation layers 164a and 164b may be formed of the same material, for example. In another example, the first upper insulation layer 164a may include silicon nitride or silicon oxynitride, and the second upper insulation layer 164b may include silicon oxide. When the first and second upper insulation layers 164a and 164b are formed of different materials from each other, the second upper insulation layer 164b, which may be directly bonded to the lower insulation layer 162, may be formed of the same material as that of the lower insulation layer 162, as described above.

As above, the bonding structure BS employed in the present example embodiment may be provided as a hybrid-bonding structure firmly bonding the stacked first to fourth semiconductor chips 100A, 100B, 100C, and 100D, together with the metal bonding structure in which the connection pad 152 and the bonding pad 154 are directly bonded.

In the present example embodiment, all the bonding structures BS may be provided as a configuration including the upper insulation layer 164 and the lower insulation layer 162 directly bonded together, along with the metal bonding structure (having direct bonding of the connection pad 152 and the bonding pads 154). In another example embodiment, only a portion of the bonding structures may be implemented as the hybrid-bonding structure described above, while others may be implemented as other types of bonding structures (for example, a bonding structure by a non-conductive film (NCF)). For example, one or two bonding structures positioned in a relatively lower portion may be implemented as the hybrid-bonding structure described above, and two or one bonding structures positioned in a relatively upper portion may be bonded using a non-conductive film (NCF).

The first to fourth semiconductor chips 100A, 100B, 100C, and 100D may be, for example, a memory chip or a logic chip. In an embodiment, the first to fourth semiconductor chips 100A, 100B, 100C, and 100D may all be the same kind of memory chip, and in another embodiment, a portion of the first to fourth semiconductor chips 100A, 100B, 100C, and 100D may be memory chips, and others may be logic chips.

For example, the memory chip may be a volatile memory chip such as a dynamic random access memory (DRAM) or a static random access memory (SRAM), or a non-volatile memory chip such as a phase-change random access memory (PRAM), a magneto-resistive random access memory (MRAM), a ferroelectric random access memory (FeRAM), or a resistive random access memory (RRAM). In an example embodiment, the first to fourth semiconductor chips 100A, 100B, 100C, and 100D may be high bandwidth memory (HBM) DRAMs.

In addition, the logic chip may be, for example, a microprocessor, an analog device, or a digital signal processor.

In an example embodiment, the semiconductor substrate 110 may include silicon. In another example embodiment, the semiconductor substrate 110 may be a semiconductor element such as germanium, or a compound semiconductor such as silicon carbide (SiC), gallium arsenide (GaAs), indium arsenide (InAs), and indium phosphide (InP). In another example embodiment, the semiconductor substrate 110 may have a silicon on insulator (SOI) structure. For example, the semiconductor substrate 110 may include a buried oxide layer (BOX layer). The semiconductor substrate 110 may include a conductive region, for example, a well doped with an impurity, or a structure doped with an impurity. In addition, the semiconductor substrate 110 may have various device isolation structures such as shallow trench isolation (STI) structures.

The semiconductor package 300A in which the first to fourth semiconductor chips 100A, 100B, 100C, and 100D are stacked is illustrated in the present example embodiment. In other example embodiments, the number of semiconductor chips stacked in the semiconductor package 300A may be varied. For example, two, three, or more semiconductor chips (for example, eight) may be stacked in the semiconductor package 300A.

The first to fourth semiconductor chips 100A, 100B, 100C, and 100D may be the same chip, and may have the same area, as illustrated in FIG. 1. In an example embodiment, the first to fourth semiconductor chips 100A, 100B, 100C, and 100D may have different areas from each other. All the side surfaces of the semiconductor chips may be not arranged to be positioned on approximately the same plane, and may have at least partly a stepped arrangement.

A connection bump 170 may be on the connection pad 152 of the first semiconductor chip 100A disposed in a lowermost position. The connection bump 170 may include a pillar structure, a ball structure, or a solder layer. The connection bump 170 may be used to electrically connect to an external circuit board. At least one of a control signal, a power supply signal, or a ground signal for operation of the first to fourth semiconductor chips 100A, 100B, 100C, and 100D may be received from an external source, a data signal to be stored in the first to fourth semiconductor chips 100A, 100B, 100C, and 100D may be received from an external source, or data stored in the first to fourth semiconductor chips 100A, 100B, 100C, and 100D may be transmitted externally, through the connection bump 170.

A molding member 180 may surround the side surfaces of the first to fourth semiconductor chips 100A, 100B, 100C, and 100D and the side surfaces of the non-conductive films 150. In an example embodiment, the molding member 180 may cover the upper surface of the fourth semiconductor chip 100D. In an example embodiment, the molding member 180 may be omitted (see FIG. 5), or the upper surface of the fourth semiconductor chip 100D may be exposed externally. The molding member 180 may include an epoxy molding compound (EMC) or the like.

As above, the bonding structure BS employed in the present example embodiment may implement firm hybrid-bonding, together with the direct bonding the connection pad 152 and the bonding pad 154, by directly bonding the lower insulation layer and the upper insulation layer. A connection bump or a non-conductive film may not be used between neighboring semiconductor chips. Thus, chip bonding with relatively high electrical reliability (reduction in transmission loss) and relatively high structural reliability may be implemented, as well as the miniaturization (slimming) of the semiconductor package.

Further, the semiconductor package having such a structure may not use a carrier substrate for grinding, for example, by performing grinding after the stacking/bonding of an unground semiconductor chips, and may also minimize occurrence of warpage in the stacking/bonding process (see FIGS. 8A to 8E, and FIGS. 10A to 10D).

Example embodiments may include other types of semiconductor packages. In an example embodiment (see FIGS. 3 and 5), the semiconductor packages 300B and 300C may be implemented using various types of base structures.

Figure 3:
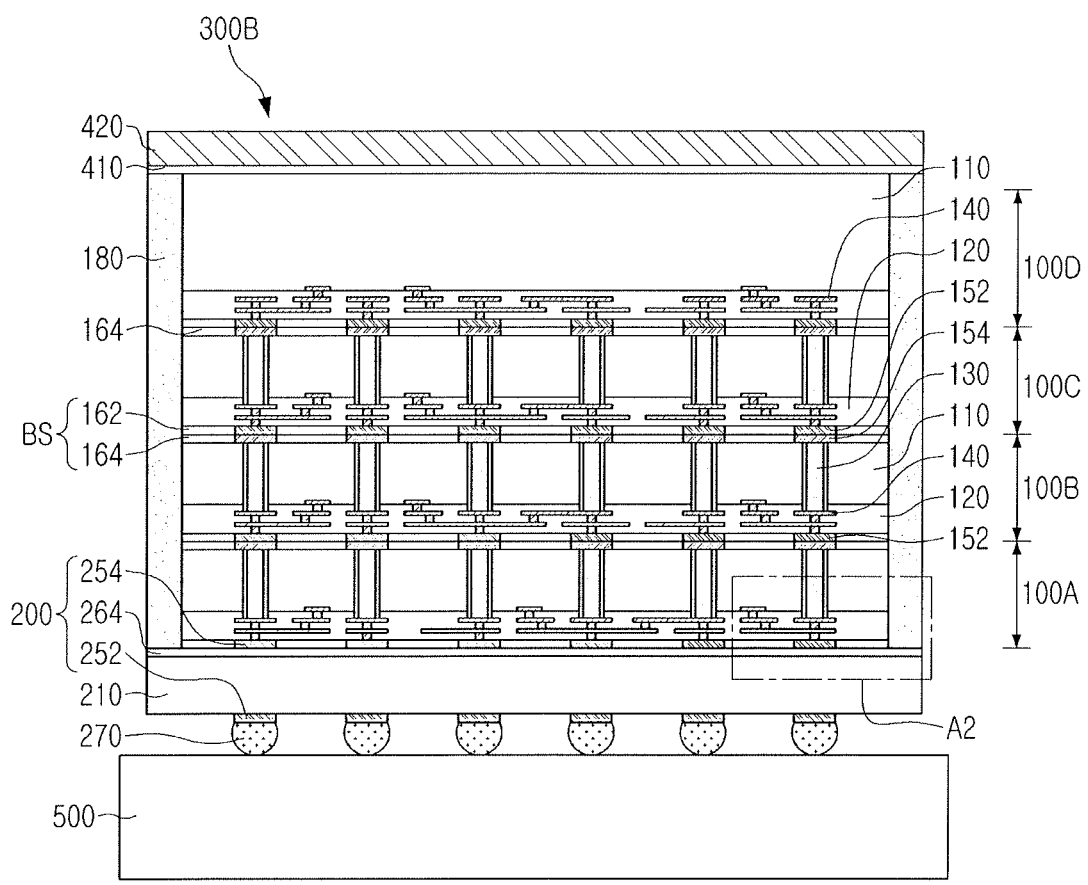
FIG. 3 illustrates a cross-sectional view of a semiconductor package according to an example embodiment.
Figure 4:
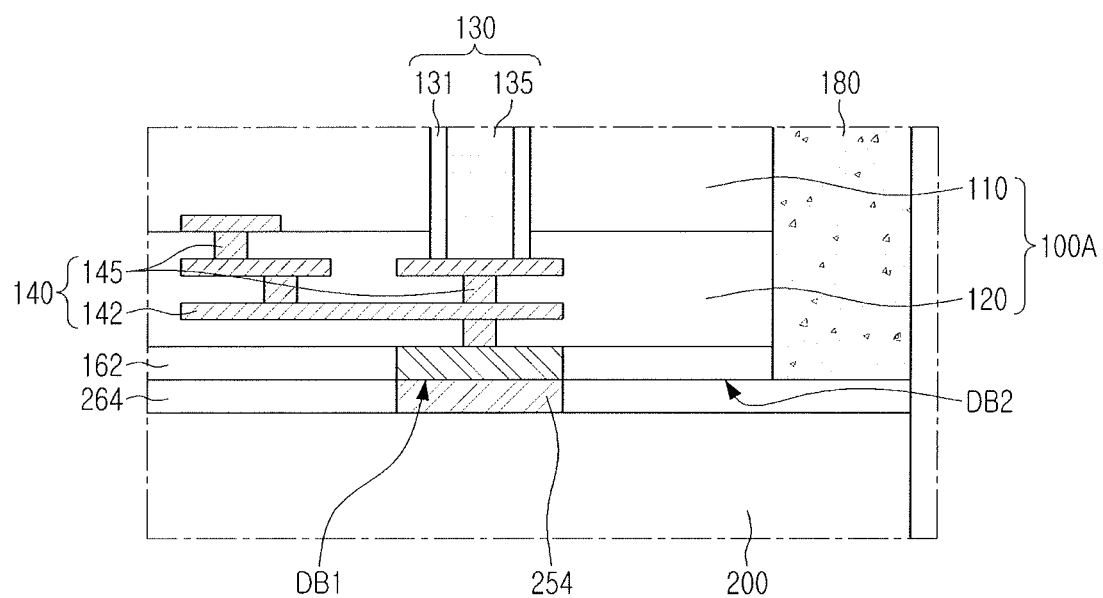
FIG. 4 illustrates an enlarged cross-sectional view of portion "A2" in FIG. 3.

FIG. 3 is a cross-sectional view illustrating a semiconductor package according to an example embodiment, and FIG. 4 is an enlarged cross-sectional view of portion "A2" in FIG. 3.

Referring to FIG. 3, it can be understood that a semiconductor package 300B according to the present example embodiment may have a structure similar to the embodiments illustrated in FIGS. 1 and 2, except for the inclusion of a base structure 200 and a heat dissipating plate 420. Therefore, the description of the embodiments illustrated in FIGS. 1 and 2 may be combined with the description of this embodiment, unless otherwise specifically stated.

The semiconductor package 300B according to the present example embodiment may further include the base structure 200, and may include first to fourth semiconductor chips 100A, 100B, 100C, and 100D stacked on the base structure 200 in the vertical direction, in a similar manner to that of the previous example embodiment. The first to fourth semiconductor chips 100A, 100B, 100C, and 100D may be bonded to each other by a hybrid-bonding structure including metal bonding of a bonding pad 154 and a connection pad 152, and direct bonding of an upper insulation layer 164 and a lower insulation layer 162, in a similar manner to that of the previous example embodiment.

The base structure 200 may be, for example, an interposer for redistribution. When the base structure 200 is an interposer, the base structure 200 may include a substrate body 210, a first pad 252, and a second pad 254 (hereinafter also referred to as "a base pad"). For example, the substrate body 210 may be formed from a silicon wafer. An internal wiring line may be formed on a lower surface, an upper surface, or inside of the substrate body 210.

A through-via for electrically connecting the first pad 252 and the second pad 254 may be formed inside of the substrate body 210. A connection bump 270 may be attached to the lower surface of the base structure 200. The connection bump 270 may be attached onto the first pad 252. The connection bump 270 may be, for example, solder balls or conductive bumps. The connection bump 270 may electrically connect the semiconductor package 300B and a printed circuit board, such as a motherboard.

A base insulation layer 264 may be formed on an upper surface of the base structure 200 in the present example embodiment, and the base insulation layer 264 may have an upper surface substantially coplanar with the second pad 254. The base insulation layer 264 may be used as a bonding structure. The bonding structure of the base structure 200 and the first semiconductor chip 100A will be described in detail with reference to FIG. 4.

Referring to FIG. 4, the base structure 200 and the first semiconductor chip 100A may be bonded in a hybrid-bonding manner similar to the bonding of neighboring semiconductor chips. The connection pad 152 of the first semiconductor chip 100A adjacent to the base structure 200 may be directly bonded to the base or second pad 254 to have a metal bonding DB1, for example, using a process in which a metal of the connection pad 152 of the first semiconductor chip 100A is in direct contact with a metal of the base or second pad 254. In addition to the metal bonding DB1, the base insulation layer 264 and the lower insulation layer 162 on the lower surface of the first semiconductor chip 100A may be directly bonded to each other (DB2) to provide a bonding structure BS1. The bonding structure BS1 may be referred to as a 'first bonding structure' to distinguish it from a bonding structure BS2 between neighboring chips, and the bonding structure BS2 between neighboring chips may be referred to as a 'second bonding structure.'

As in the present example embodiment, the first to fourth semiconductor chips 100A, 100B, 100C, and 100D have the same area, while the base structure 200 may have an area larger than that of the semiconductor chips. The base insulation layer 264 may have a portion not covered with the semiconductor chips.

The molding member 180 may be formed on the base structure 200 to cover a portion or all of the first to fourth semiconductor chips 100A, 100B, 100C, and 100D. The molding member 180 may include, for example, an epoxy molding compound. As illustrated in FIG. 3, the molding member 180 may be on the base structure 200, and may have a side surface substantially planar with a side surface of the base structure 200. These coplanar side surfaces may be side surfaces obtained in a same cutting process.

The semiconductor package 300B according to the present example embodiment may further include a thermally conductive material layer 410 and a heat dissipating plate 420 arranged on the upper surface of the fourth semiconductor chip 100D in sequence. The thermally conductive material layer 410 may be disposed between the heat dissipating plate 420 and the fourth semiconductor chip 100D, and may cover an upper surface of the fourth semiconductor chip 100D. The thermally conductive material layer 410 may assist to smoothly dissipate heat generated by the first to fourth semiconductor chips 100A, 100B, 100C, and 100D to the heat dissipating plate 420. The thermally conductive material layer 410 may be made of a thermal interface material (TIM). For example, the thermally conductive material layer 410 may be made of an insulating material, or may be made of a material including an insulating material and capable of maintaining electrical insulation. The thermally conductive material layer 410 may include, for example, an epoxy resin. Specific examples of the thermally conductive material layer 410 may include a mineral oil, a grease, a gap filler putty, a phase change gel, a phase change material pad, or a particle filled epoxy.

The heat dissipating plate 420 may be on the thermally conductive material layer 410. The heat dissipating plate 420 may be, for example, a heat sink, a heat spreader, a heat pipe, or a liquid cooled cold plate.

The thermally conductive material layer 410 completely covering the upper surface of the fourth semiconductor chip 100D may increase a contact area between the fourth semiconductor chip 100D and the thermally conductive material layer 410. Therefore, heat generated by the first to fourth semiconductor chips 100A, 100B, 100C, and 100D may be more efficiently transferred to the heat dissipating plate 420.

Figure 5:
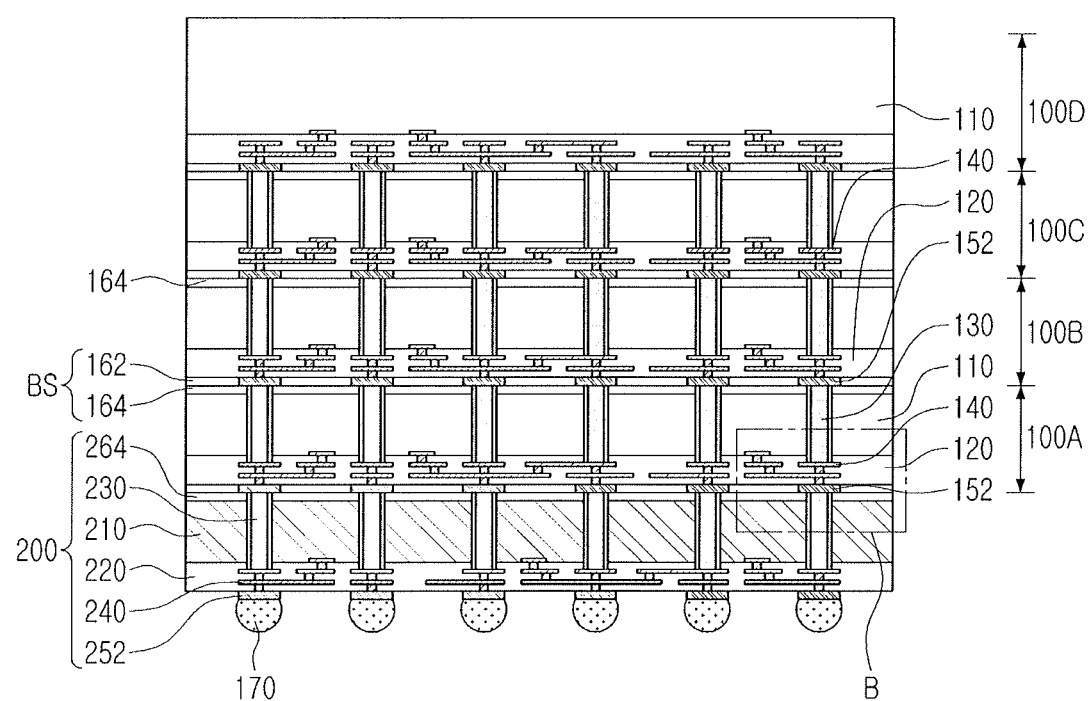
FIG. 5 illustrates a cross-sectional view of a semiconductor package according to an example embodiment.
Figure 6:
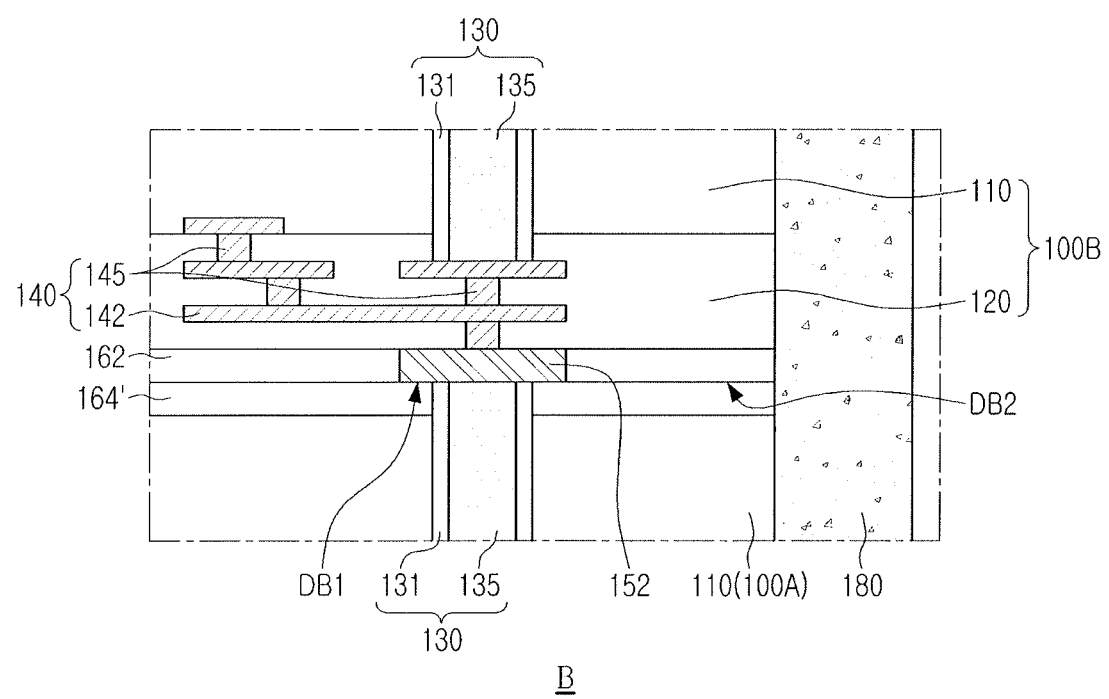
FIG. 6 illustrates an enlarged cross-sectional view of portion "B" in FIG. 5.

FIG. 5 is a cross-sectional view illustrating a semiconductor package according to an example embodiment, and FIG. 6 is an enlarged cross-sectional view of portion "B" in FIG. 5.

Referring to FIG. 5, a semiconductor package 300C according to the present example embodiment may have a structure similar to the embodiment illustrated in FIG. 1, except that a base structure 200' is included, and metal bonding structures are different from each other. Therefore, the description of the embodiment illustrated in FIG. 1 may be combined with the description of this embodiment, unless otherwise specifically stated.

The semiconductor package 300C according to the present example embodiment may include the base structure 200', and may include first to fourth semiconductor chips 100A, 100B, 100C, and 100D stacked on the base structure 200' in the vertical direction, in a similar manner to that of the previous example embodiment. The base structure 200' may be different from the base structure 200 illustrated in FIG. 3, and may include a substrate body 210, a semiconductor device layer 220, a through-electrode 230, a wiring structure 240, a first pad 252, and a second pad 254, in a similar manner to that of the first to fourth semiconductor chips 100A, 100B, 100C, and 100D. For example, the semiconductor device layer 220 may include a logic device. The base structure 200' may have substantially the same size as the first to fourth semiconductor chips 100A, 100B, 100C, and 100D.

The bonding structure employed in the present example embodiment may have a direct bonding DB2 between insulation layers, in a similar manner to that of the previous example embodiment. For example, a base insulation layer 264 of the base structure 200' and a lower insulation layer 162 of the first semiconductor chip 100A may be directly bonded to each other, and an upper insulation layer 164' and the lower insulation layer 162 of neighboring semiconductor chips may be directly bonded to each other.

The metal bonding DB1 in the present example embodiment may be realized by bonding a through-electrode 130 directly to a connection pad 152 of a neighboring semiconductor chip without bonding pads. For example, as illustrated in FIG. 6, the through-electrode 130 may pass through the upper insulation layer 164'. In an example embodiment, the through-electrode 130 may have an upper surface substantially planar with an upper surface of the upper insulation layer 164'. In the present example embodiment, the through-electrode 130 may be metal-bonded (DB1) to a connection pad 152 of the semiconductor chip (for example, the second semiconductor chip 100B) positioned thereon without a separate bonding pad. The through-electrode 130 of the base structure 200' and the connection pads 152 of the first semiconductor chip 100A, and the connection pad 152 of a neighboring semiconductor chip and a neighboring through-electrode 130 may be metal-bonded to each other, respectively.

In an example embodiment, even when an area of the upper surface of the through-electrode 130 is relatively small, so as not to be bonded with high strength, an electrical connection may be made, and bonding of the first and second semiconductor chips 100A and 100B may be sufficiently ensured by direct bonding between the upper insulation layer 164' and the lower insulation layer 162.

FIGS. 7A to 7H are cross-sectional views illustrating main processes of a method of manufacturing a semiconductor package according to an example embodiment.

Referring to FIG. 7A, a semiconductor wafer W for a base structure 200 may be prepared.

For convenience of explanation, the semiconductor wafer W may be illustrated as including three base structures 200. Each base structure 200 may include a first pad 252 and a second pad 254 (also referred to as "a base pad"). A through-via, or a wiring line pattern for electrically connecting the first pad 252 and the second pad 254 may be formed inside of the base structure 200. A connection bump 270 such as a solder ball may be formed on the first pad 252 of the base structure 200. In the present example embodiment, the base structure 200 may be an interposer. In another example embodiment, the base structure 200 may be a structure in which a logic chip or a memory chip is implemented, respectively.

As illustrated, the semiconductor wafer W on which the connection bump 270 is formed may be attached to a carrier substrate 500. The carrier substrate 500 may include a support substrate 510 and an adhesive material layer 520. The semiconductor wafer W may be attached to the carrier substrate 500 such that the connection bump 270 faces the carrier substrate 500. The connection bump 270 may be covered by the adhesive material layer 520. A portion of the lower surface of the semiconductor wafer W in which the connection bump 270 is not formed may be bonded to the adhesive material layer 520, and may stably be supported during a subsequent process.

Next, referring to FIG. 7B, a plurality of first semiconductor chips 100A may be stacked/bonded to the base structure 200, respectively.

The plurality of first semiconductor chips 100A used in this operation may be obtained by a singulation process without grinding. This process may be performed by aligning connection pads 152 of the respective first semiconductor chips 100A to correspond to the base or second pad 254 of the base structure 200, and by a thermocompression process at a constant temperature (for example, about 400° C. or less).

A hybrid-bonding of the plurality of first semiconductor chips 100A and the base structures 200 may be formed through the thermocompression process. The connection pads 152 of the first semiconductor chips 100A may be directly bonded to the base or second pad 254 of the base structure 200, and a lower insulation layer 162 of the plurality of first semiconductor chips 100A may be directly bonded to a base insulation layer 264 of the base structure 200.

The plurality of first semiconductor chips 100A may have a relatively thick thickness (e.g., a state before a grinding process), and may thus be handled more smoothly in a series of alignment and thermocompression processes.

Next, referring to FIG. 7C, a resin portion 190A may be formed on the base structure 200 between the plurality of first semiconductor chips 100A.

The resin portion 190A formed in this operation may be employed to support a plurality of first semiconductor chips 100A in a subsequent grinding operation. The resin portion 190A may be formed to surround a bonded first semiconductor chip 100A, and may be formed on an extended base insulation layer 264. The operation of forming the resin portion 190A may be performed by a dispensing process or a spin coating process using a curable liquid resin, for example.

In an example embodiment (see FIGS. 9A to 9D), the operation of forming the resin portion 190A may be omitted, for example, when the first semiconductor chips 100A are firmly supported by a hybrid-bonding. A material constituting the resin portion 190A may be used as a molding member (190 in FIG. 8) in the final structure.

Referring to FIG. 7D, a portion of the plurality of first semiconductor chips 100A may be removed to expose a through-electrode 130.

An upper end 130T of the through-electrode 130 may be made to protrude from an exposed surface of the first semiconductor chip 100A, for example, an upper surface of the semiconductor substrate 110, by removing a portion of the plurality of first semiconductor chips 100A. Through this operation, a thickness of the first semiconductor chip 100A may be reduced to a desired thickness. Such a partial removal operation may be a grinding process such as a chemical mechanical polishing (CMP) process, an etch-back process, or a combination thereof. For example, a thickness of the first semiconductor chip 100A may be reduced by performing a grinding process, and an etch-back of an appropriate condition may be applied to expose the through-electrode 130. By this operation, the resin portion 190A may also have an upper surface substantially coplanar with an upper surface of the first semiconductor chip 100A. The resin portion 190A may not have such a coplanar upper surface, depending on a formation height of the resin portion 190A or a removal thickness of the first semiconductor chip 100A.

The operation of thinning the first semiconductor chip 100A may be performed in a state in which it is hybrid-bonded to the base structure 200. Thus, a first semiconductor substrate 100 may not be subjected to a separate grinding process for reducing the thickness at a wafer level. Therefore, a carrier substrate for grinding at the wafer level may not be used, and an operation such as a bonding with the carrier substrate may be omitted, thereby simplifying fabrication.

Figure 7E:
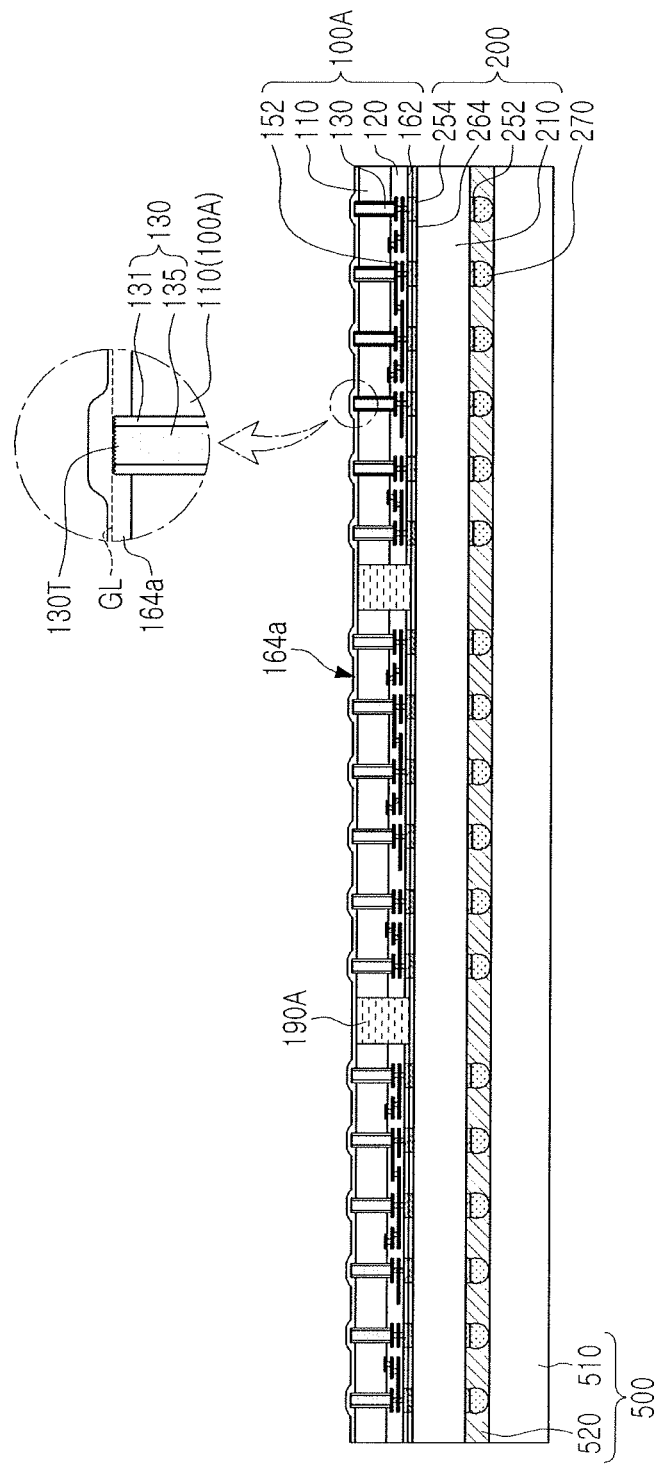

Referring to FIG. 7E, a first upper insulation layer 164a may be formed on the first semiconductor chip 100A to cover the exposed upper end 130T of the through-electrode 130.

The first upper insulation layer 164a may be used as a passivation layer. For example, the first upper insulation layer 164a may include silicon nitride or silicon oxynitride. The first upper insulation layer 164a formed in this operation may also extend to the upper surface of the resin portion 190A.

Figure 7F:
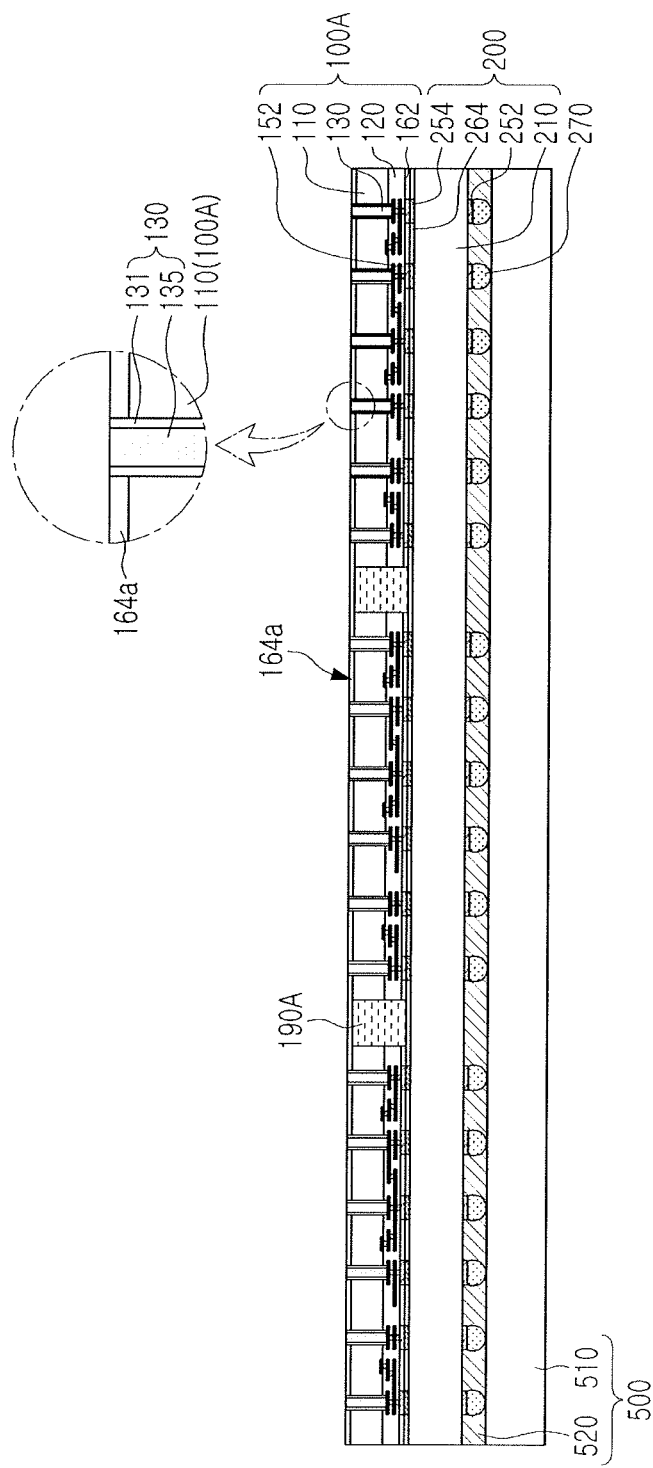

Referring to FIG. 7F, the first upper insulation layer 164a may be ground to expose the through-electrode 130.

The first upper insulation layer 164a may be partially removed by performing a grinding operation up to a predetermined line GL to sufficiently expose the through-electrode 130. Through this grinding operation, the first upper insulation layer 164a may have an upper surface substantially coplanar with the upper surface of the through-electrode 130. Also, a damaged portion of the upper end 130T of the through-electrode 130 may be removed. In an example embodiment (see FIG. 5), additional semiconductor chips (for example, a second semiconductor chip) may be stacked/bonded without the bonding pad formation operation (FIG. 7G) after this operation. In this case, the first upper insulation layer 164a may be formed of the same material (for example, silicon oxide) as the lower insulation layer 162 of the second semiconductor chip 100B to be directly bonded.

Figure 7G:
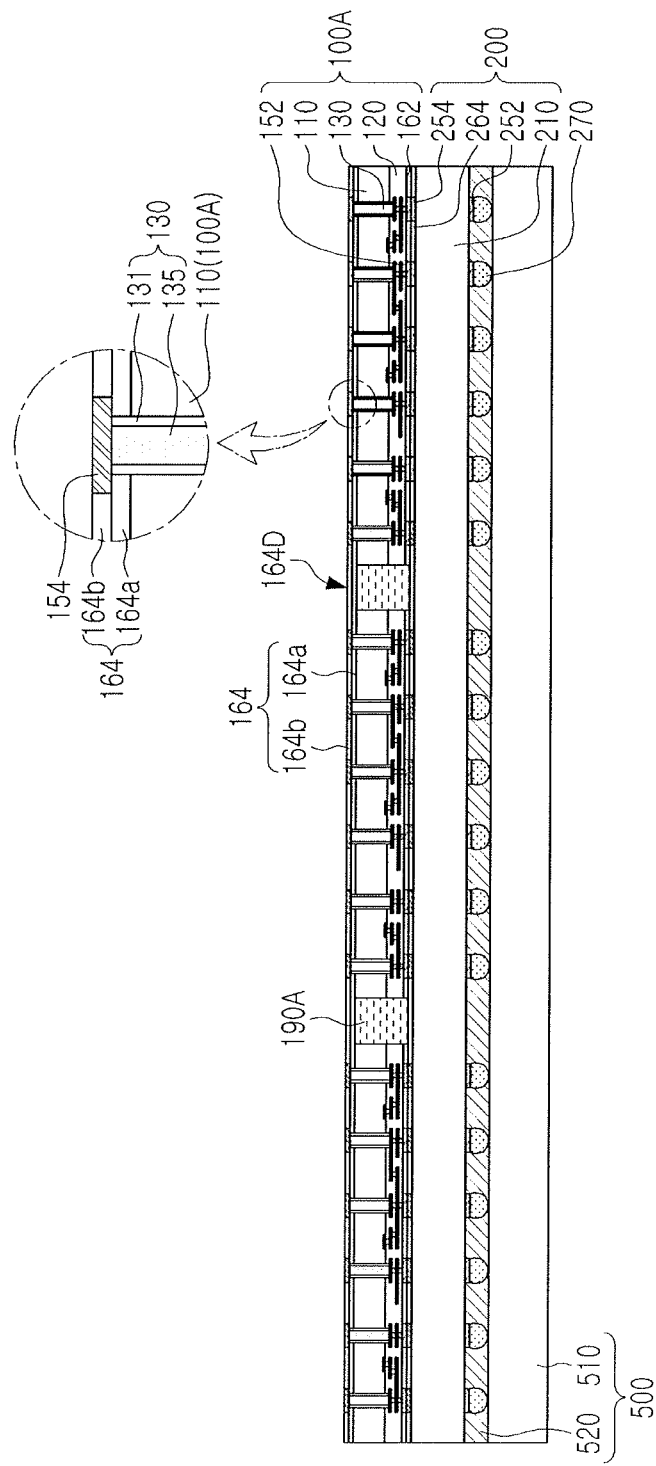

Referring to FIG. 7G, a second upper insulation layer 164b and a bonding pad 154 may be formed on the first upper insulation layer 164a.

For example, after the second upper insulation layer 164b is formed on the first upper insulation layer 164a, an opening may be formed in the second upper insulation layer 164b to expose the through-electrode 130, and a plating process and/or a damascene process may be used to form the bonding pad 154. The bonding pad 154 may be connected to the through-electrode 130. In addition, the bonding pad 154 may have an upper surface substantially coplanar with an upper surface of the second upper insulation layer 164b. The first and second upper insulation layers 164a and 164b may be formed of the same material, for example. For example, the second upper insulation layer 164b may include silicon oxide.

The first and second upper insulation layers 164a and 164b may be collectively referred to as the upper insulation layer 164. The upper insulation layer 164 may be positioned on the upper surface of the first semiconductor chip 100A, and may extend to the upper surface of the resin portion 190A. A portion positioned on the resin portion 190A may be distinguished from other portions used as a passivation layer, and may be referred to as a dummy insulation portion 164D in this specification.

Figure 7H:
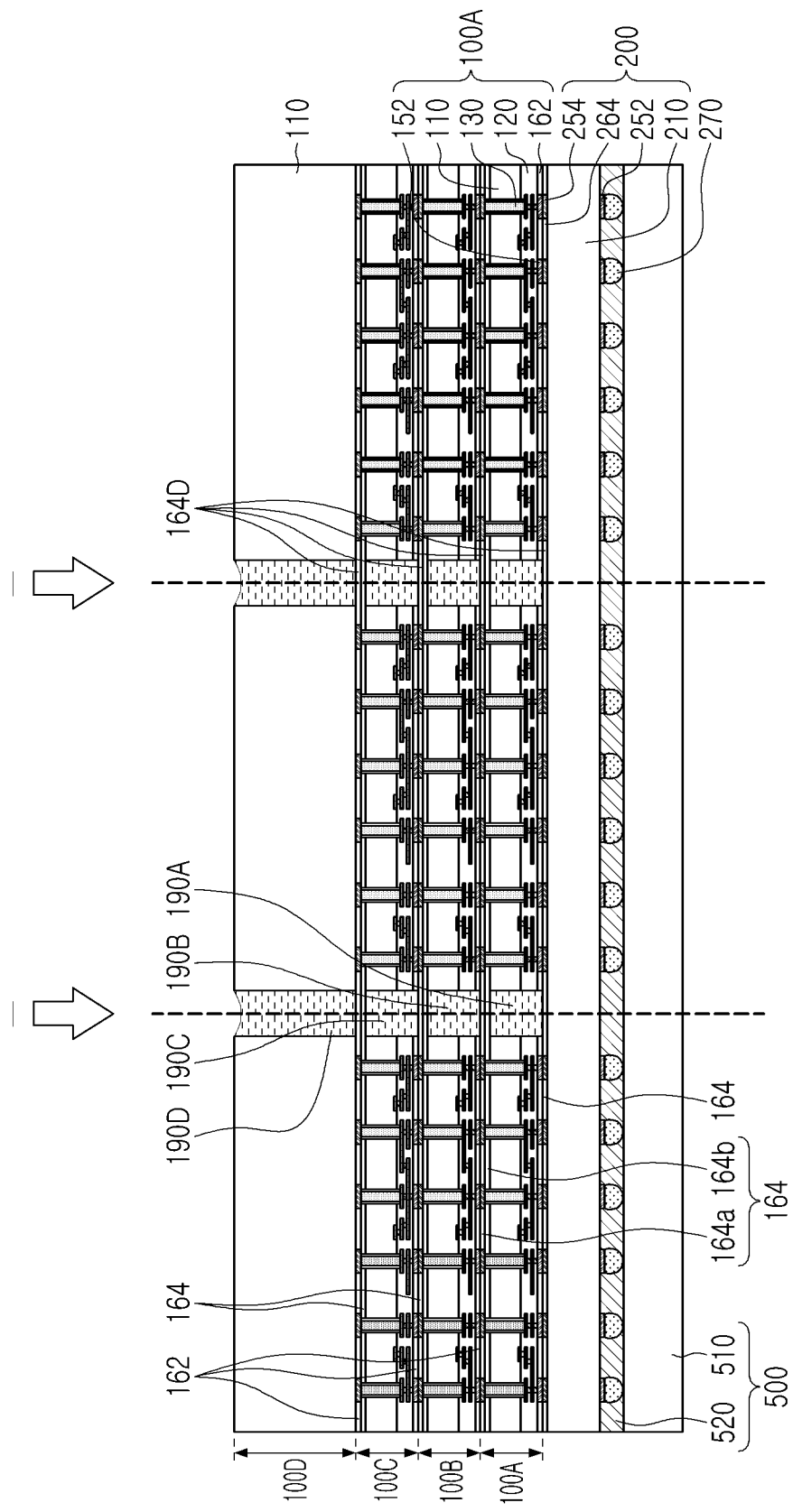

Referring to FIG. 7H, the second to fourth semiconductor chips 100B, 100C, and 100D may be sequentially stacked/bonded by repeating the operations of FIGS. 7B to 7G in whole or in part.

The stacking/bonding operation of the second and third semiconductor chips 100B and 100C having the through-electrode 130 may be performed by repeating the processes of FIGS. 7B to 7G as a whole. In this repeated operation, resin portions 190B and 190C positioned on levels corresponding to the second and third semiconductor chips 100B and 100C, respectively, and a dummy insulation portion 160D may be additionally stacked, in a similar manner to that of the resin portion 190A and the dummy insulation portion 160D.

In the case of the fourth semiconductor chip 100D having no through-via, only a portion of the processes may be repeatedly performed. Where the fourth semiconductor chip 100D does not have a semiconductor chip disposed thereon, an additional bonding pad formation operation may not be performed. Therefore, only the stacking and bonding operations (see FIG. 7B) of the fourth semiconductor chip 100D before a grinding operation, and the grinding operation (see FIGS. 7C and 7D) using a resin portion 190D may be performed. The resin portion 190D may remain, but the bonding pad operation may be not performed, such that a dummy insulation portion may be not formed on the upper surface of the resin portion 190D. In an example embodiment, a grinding operation of the fourth semiconductor chip 100D may limited or omitted such that the final thickness thereof may be greater than other semiconductor chips therebelow.

Figure 8:
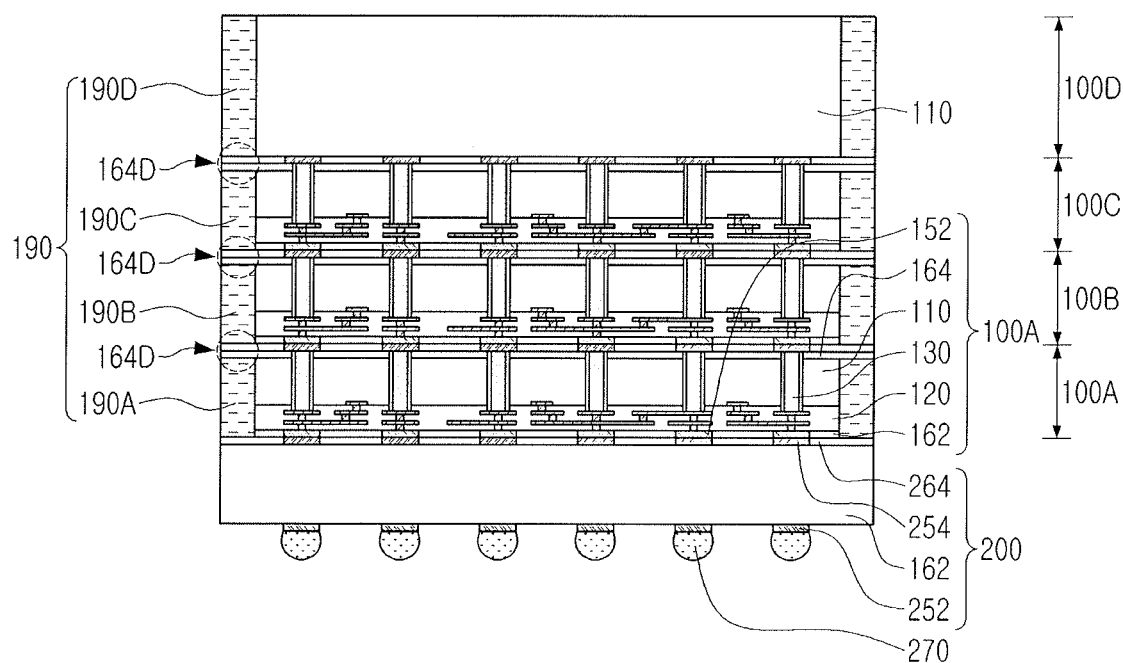
FIG. 8 illustrates a cross-sectional view of a semiconductor package according to an example embodiment.

FIG. 8 is a cross-sectional view illustrating a semiconductor package according to an example embodiment. A semiconductor package 300D illustrated in FIG. 8 may be a semiconductor package obtained by cutting the resultant of FIG. 7H.

Referring to FIG. 8, the semiconductor package 300D according to the present example embodiment may be similar to the embodiment illustrated in FIGS. 3 and 4, except that a molding member 190 of another type is included and a heat dissipating plate is not included. Therefore, the description of the embodiments illustrated in FIGS. 3 and 4 may be combined with the description of this embodiment, unless otherwise specifically stated.

In the present example embodiment, the first to fourth semiconductor chips 100A, 100B, 100C, and 100D may be sequentially stacked on the base structure 200, and may be bonded by the hybrid-bonding described above. In the present example embodiment, the base structure 200 has an area larger than that of the first to fourth semiconductor chips 100A, 100B, 100C, and 100D each having the same size.

The molding member 190 employed in the present example embodiment may include a plurality of resin portions 190A, 190B, 190C, and 190D stacked on the base insulation layer 264 around the semiconductor chips 100A, 100B, 100C, and 100D, and a plurality of dummy insulation portions 164D on upper surfaces of the plurality of resin portions 190A, 190B, 190C, and 190D, in a different manner to that of the previous example embodiment.

The plurality of resin portions 190A, 190B, 190C, and 190D may have an upper surface substantially coplanar with the upper surfaces of the first to fourth semiconductor chips 100A, 100B, 100C, and 100D, respectively.

The plurality of dummy insulation portions 164D may be formed of the upper insulation layer 164 of the first to third semiconductor chips 100A, 100B, and 100C, for example, an insulation layer extending from the second bonding insulation layer. In the present example embodiment, the plurality of dummy insulation portions 164D may include the same material layers as the first and second upper insulation layers 164a and 164b, respectively.

FIGS. 9A to 9D are cross-sectional views illustrating main processes of a method of manufacturing semiconductor package according to an example embodiment.

Figure 9A:
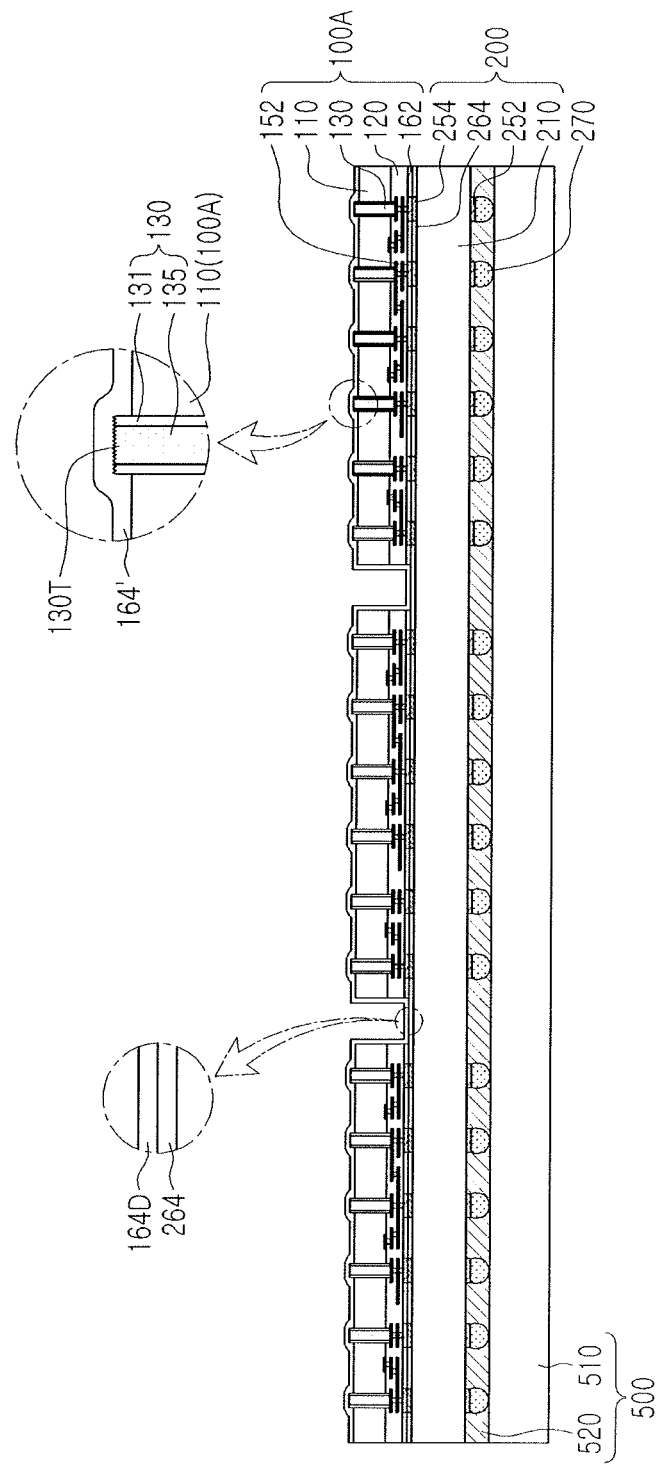
FIGS. 9A to 9D illustrate cross-sectional views of main processes of a method of manufacturing semiconductor package according to an example embodiment.

In a different manner to that of the operations of FIGS. 7D and 7E, the operation illustrated in FIG. 9A may be the grinding operation and the formation operation of the upper insulation layer, without the introduction of the resin portion formation operation illustrated in FIG. 7C after the stacking/bonding operation of the first semiconductor chip illustrated in FIG. 7B.

As described above, the first semiconductor chips 100A may be firmly supported on the base structure 200 by the hybrid-bonding. Thus, the grinding operation of the first semiconductor chips may be performed without first forming a resin portion.

Referring to FIG. 9A, an upper insulation layer 164' may be formed on upper surfaces of the first semiconductor chips that have been ground, and may cover the exposed the through-electrode. The upper insulation layer 164' may be formed of the same material (for example, silicon oxide) as the lower insulation layer 162 of the second semiconductor chip 100B to be directly bonded thereto.

As shown in the left inset in FIG. 9A, the upper insulation layer 164' may also be formed in a region between adjacent ones of the first semiconductor chips 100A. In the present example embodiment, the upper insulation layer 164' may extend to the base insulation layer 264 around the first semiconductor chips 100A. In an example embodiment, the upper insulation layer 164' may also be formed on a side surfaces of the first semiconductor chips 100A. A portion formed around the first semiconductor chips 100A in the operation of forming the upper insulation layer 164' may be referred to as a dummy insulation portion.

Figure 9B:
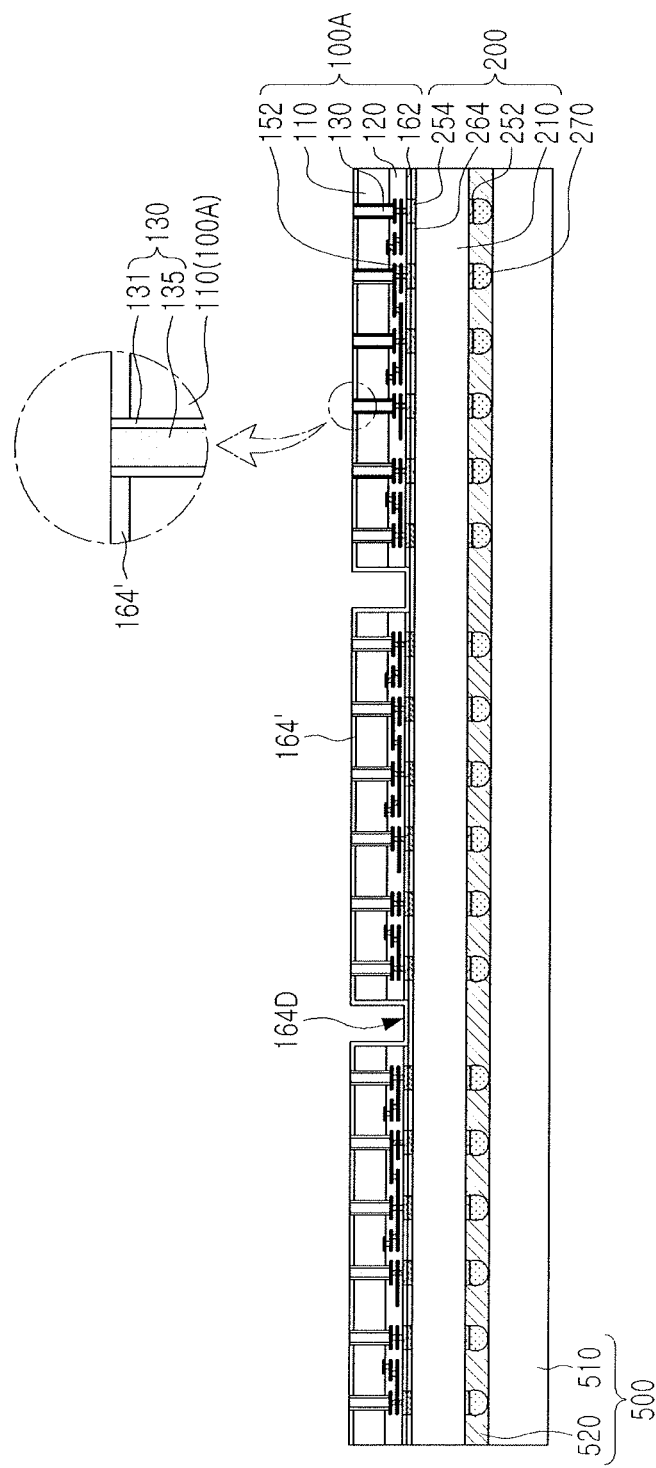

Referring to FIG. 9B, the upper insulation layer 164' may be ground such that the through-electrode 130 is exposed again. After the grinding operation, the upper insulation layer 164' may have an upper surface substantially coplanar with the upper surface of the through-electrode 130. In addition, a damaged portion of the upper end 130T of the through-electrode 130 may be removed.

Figure 9C:
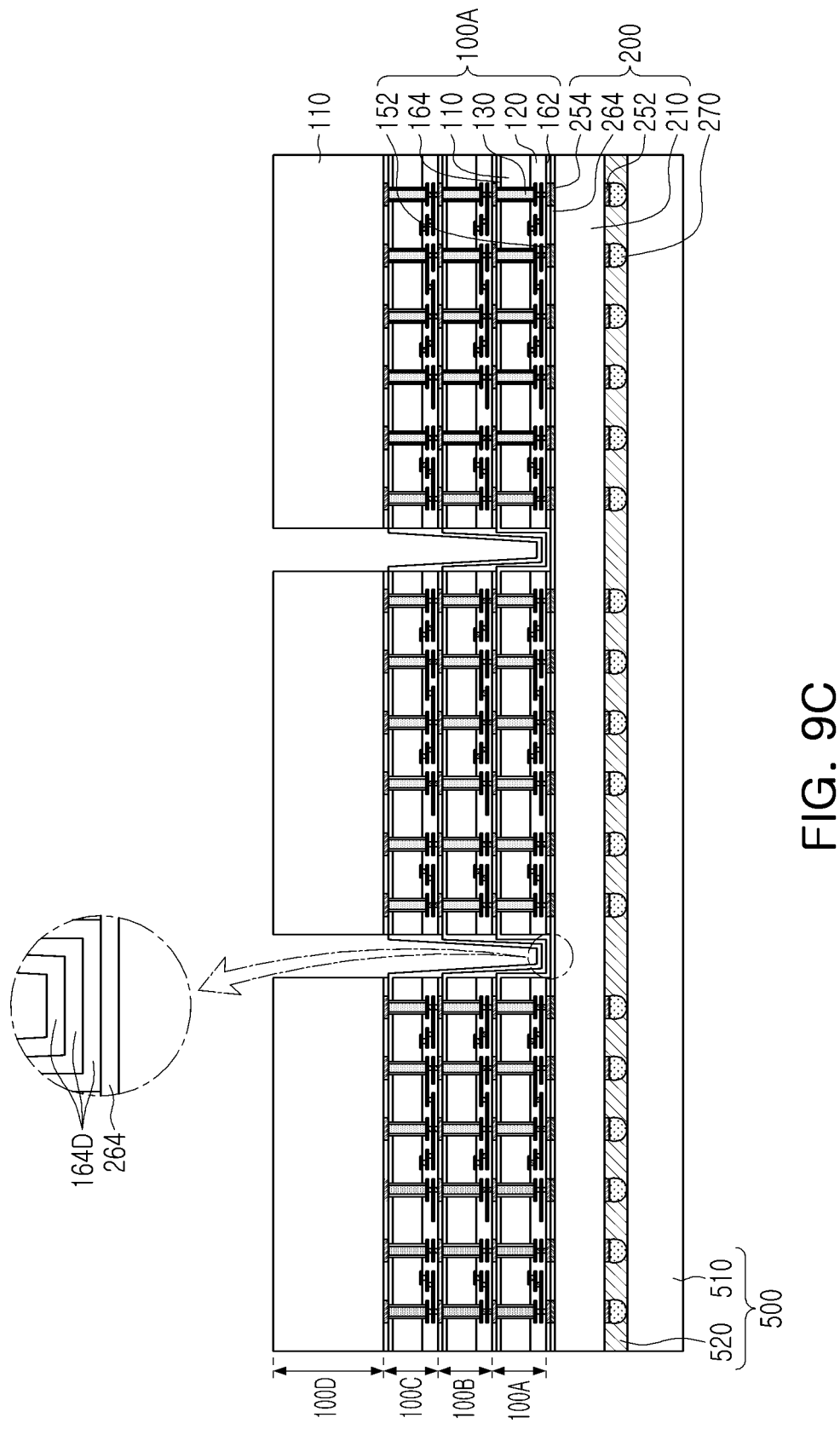

Next, referring to FIG. 9C, a second semiconductor chip 100B (not ground) may be stacked/bonded on the first semiconductor chip 100A. The operations illustrated in FIGS. 9A and 9B may be repeatedly performed in whole or in part together with a series of grinding operations to stack/bond the third and fourth semiconductor chips 100C and 100D.

The stacking and bonding operations according to the present example embodiment may be performed by aligning the connection pad 152 of the second semiconductor chip 100B to correspond to the through-electrode 130 of the first semiconductor chip 100A, and performing a thermocompression process. Hybrid-bonding of the first and second semiconductor chips 100A and 100B may be formed through the thermocompression process.

For example, the connection pads 152 of the plurality of second semiconductor chips 100B may be directly bonded to the through-electrodes 130 of the respective first semiconductor chips 100A. Also, a lower insulation layer 162 of an upper second semiconductor chip 100B may be directly bonded to the upper insulation layer 164 of a lower second semiconductor chip 100B directly thereunder. The third and fourth semiconductor chips 100C and 100D may also be bonded onto the second and third semiconductor chips 100B and 100C through a process similar to the hybrid-bonding of the first and second semiconductor chips 100A and 100B.

Referring to the inset in FIG. 9C, a plurality of dummy insulation portions 160D may be stacked on the base insulation layer 264 around the stacked first to fourth semiconductor chips 100A, 100B, 100C, and 100D. For example, the plurality of dummy insulation portions 160D may be formed to correspond to the upper insulation layer 164 of the first to third semiconductor chips 100A, 100B, and 100C, for example, the second bonding insulation layer. Therefore, for example, the dummy insulation portion 164D formed on the base insulation layer 264 may be three layers. The dummy insulation portion 164D may include the same insulating material as each upper insulation layer 164, since it may be formed with the upper insulation layer 164 (e.g., because it may be a portion of the upper insulation layer 164).

Figure 9D:
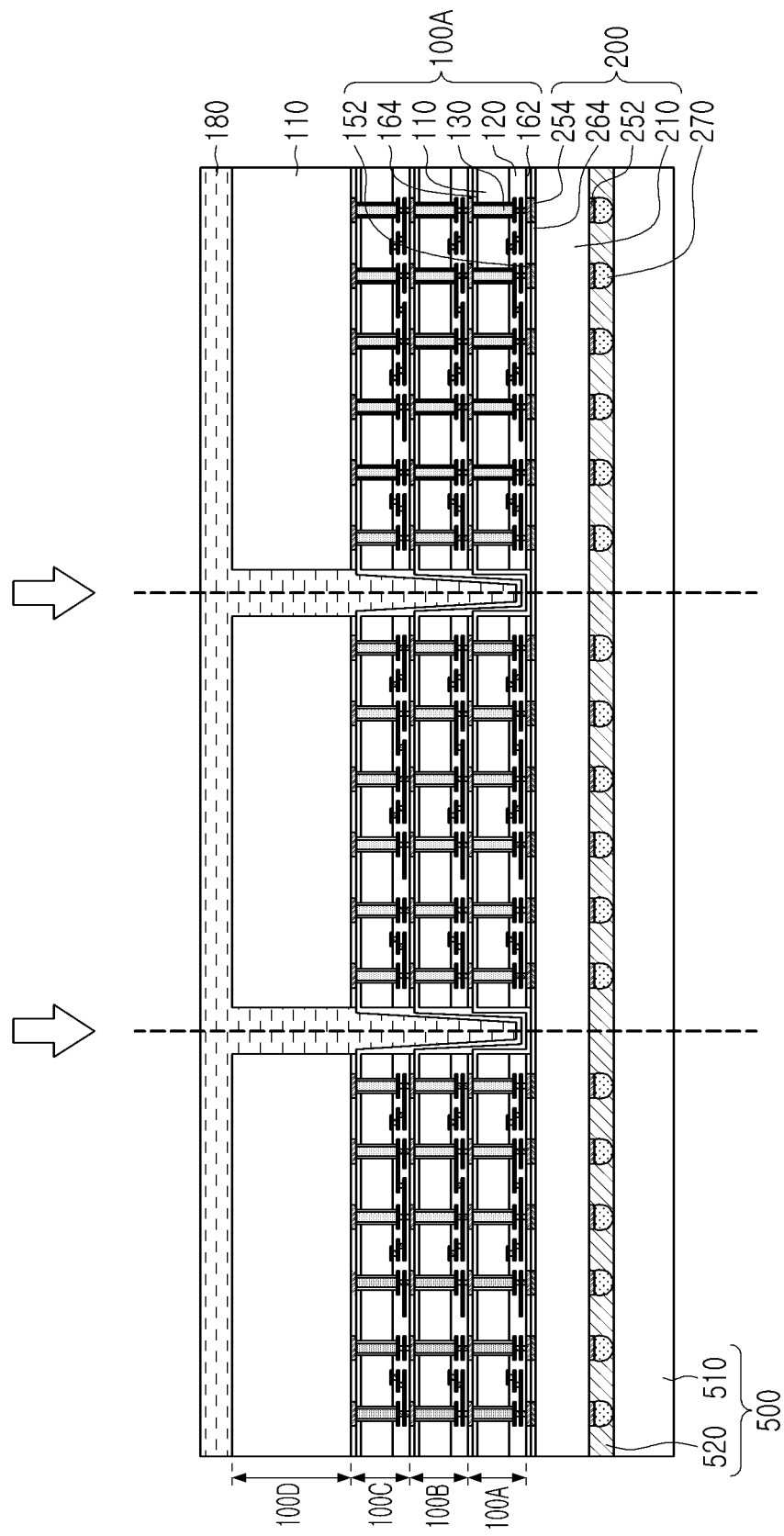

Next, referring to FIG. 9D, a molding member 180 may be formed such that a space between the stacked first to fourth semiconductor chips 100A, 100B, 100C, and 100D is filled.

In the present example embodiment, the molding member 180 may be on the stack of the dummy insulation portions 160D, and may surround the side surfaces of the first to fourth semiconductor chips 100A, 100B, 100C, and 100D. The molding member 180 may also cover the upper surface of the fourth semiconductor chip 100D. The molding member 180 may include, for example, an epoxy molding compound (EMC) or the like.

Figure 10:
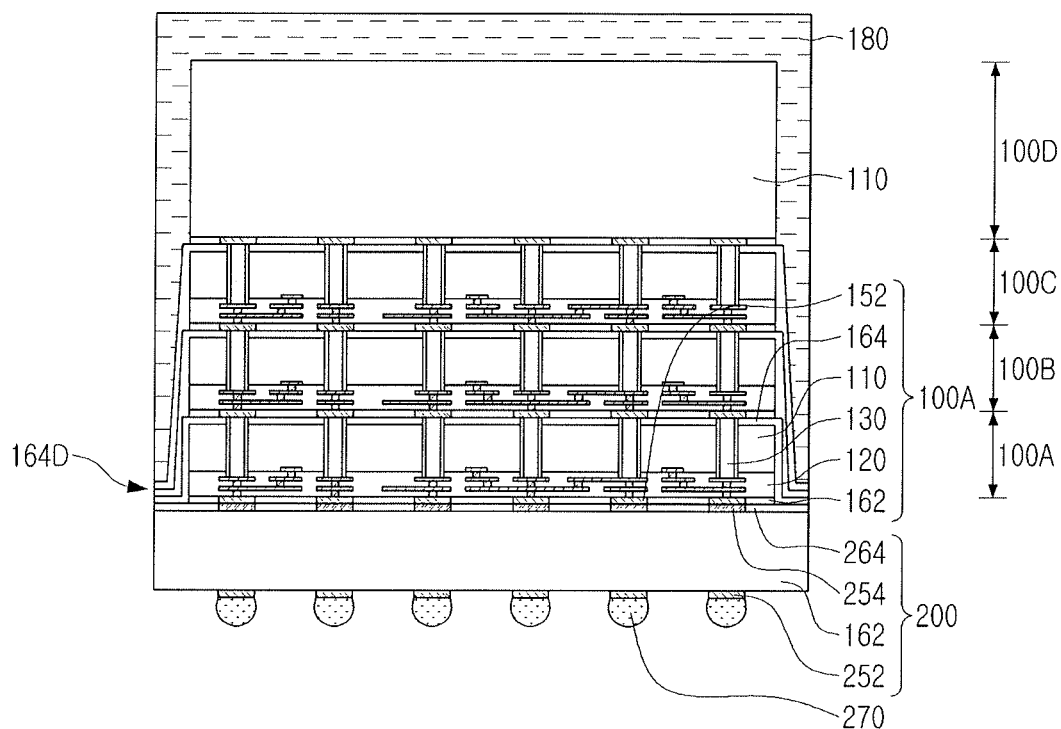
FIG. 10 illustrates a cross-sectional view of a semiconductor package according to an example embodiment.

FIG. 10 is a cross-sectional view illustrating a semiconductor package according to an example embodiment. A semiconductor package 300E illustrated in FIG. 10 may be a semiconductor package obtained by cutting the resultant of FIG. 9D.

Referring to FIG. 10, the semiconductor package 300E according to the present example embodiment may have a structure similar to the embodiment illustrated in FIG. 8, except that another type of molding member 180 is included, and the metal bonding structures are different. Therefore, the description of the embodiment illustrated in FIG. 8 may be combined with the description of this embodiment, unless otherwise specifically stated.

As illustrated in FIG. 10, first to fourth semiconductor chips 100A, 100B, 100C, and 100D may be sequentially stacked on a base structure 200, and may be bonded by the hybrid-bonding described above. Direct metal bonding in the present example embodiment may be performed by directly bonding a through-electrode 130 to a connection pad 152 of a neighboring semiconductor chip, without a bonding pad. This may be explained with reference to the embodiments illustrated in FIGS. 5 and 6.

The base structure 200 may have an area larger than that of the first to fourth semiconductor chips 100A, 100B, 100C, and 100D, each having the same size. In the manufacturing process according to the present example embodiment, as described above (see FIG. 9A), the resin portion may be not used in a grinding operation. Therefore, only a plurality of dummy insulation portions 160D may be stacked on a base insulation layer 264 around the first to fourth semiconductor chips 100A, 100B, 100C, and 100D, and a molding member 180 may be formed in a space above the dummy insulation portion 160D. The plurality of dummy insulation portions 160D may be an upper insulation layer 164 of the first to third semiconductor chips 100A, 100B, and 100C, for example, an insulation layer extending from a second bonding insulation layer. The plurality of dummy insulation portions 160D may include the same material layers as the upper insulation layer 164.

Referring to FIGS. 7A to 7H and 9A to 9D, although the manufacturing method of the semiconductor packages 300D and 300E illustrated in FIGS. 8 and 10 has been described, the other types of semiconductor packages 300A, 300B, and 300C may be likewise manufactured.

For example, the semiconductor package 300B illustrated in FIG. 3 may be formed as described with reference to the processes illustrated in FIGS. 7A to 7H, except that the dummy insulation portion and the resin portion are removed, or the resin portion is not used in the grinding operation, and the dummy insulation portion is removed, and then a separate molding member and a heat dissipating plate are formed.

Figure 11:
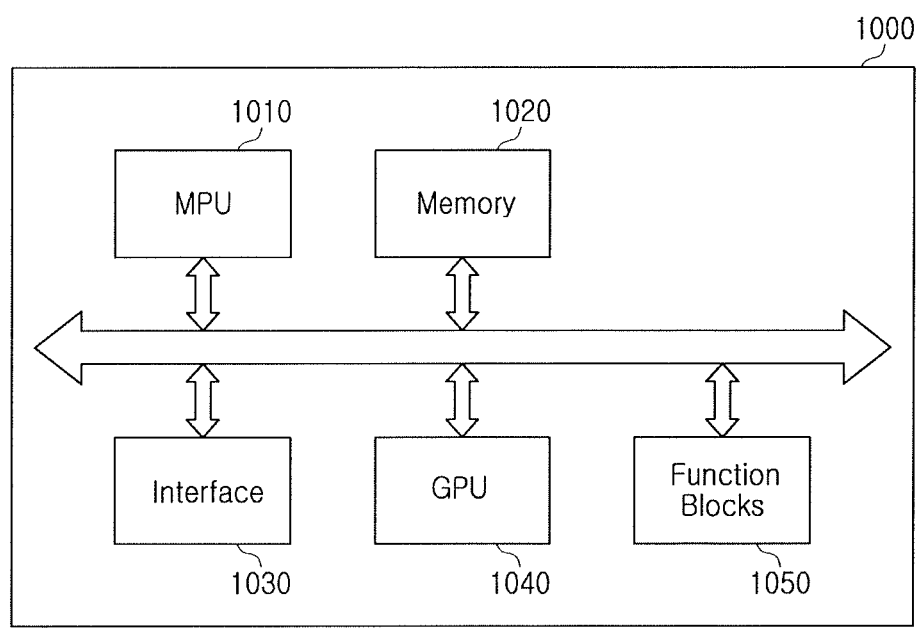
FIG. 11 illustrates a block diagram of a configuration of a semiconductor package according to an example embodiment.

FIG. 11 is a block diagram illustrating a configuration of a semiconductor package according to an example embodiment.

Referring to FIG. 11, a semiconductor package 1000 may include a microprocessor 1010, a memory 1020, an interface 1030, a graphics processor 1040, functional blocks 1050, and a bus 1060 connecting therebetween. The semiconductor package 1000 may include both the microprocessor 1010 and the graphics processor 1040, or may include only one thereof.

The microprocessor 1010 may include a core and an L2 cache. For example, the microprocessor 1010 may include a multi-core. Each core of the multi-core may have the same or different performance. Further, the cores of the multi-core may be activated at the same time, or may be activated at different times from each other.

The memory 1020 may store results, and the like, processed in the functional blocks 1050 under the control of the microprocessor 1010. The interface 1030 may exchange information and signals with external devices. The graphics processor 1040 may perform graphics functions. For example, the graphics processor 1040 may perform a video codec or process 3D graphics. The functional blocks 1050 may perform various functions. For example, when the semiconductor package 1000 is an AP used in a mobile device, a portion of the functional blocks 1050 may perform a communications function. Here, the semiconductor package 1000 may include the semiconductor packages 300A, 300B, 300C, 300D, and 300E described in FIGS. 1, 3, 4, 8, and 10.

By way of summation and review, to realize relatively high performance and relatively large capacity together with miniaturization and weight reduction, consideration has been given to semiconductor chips including a through-electrode (e.g., a through silicon via (TSV)) and semiconductor packages in which the semiconductor chips are stacked.

As described above, embodiments may provide a semiconductor package that may be amenable to miniaturization (for example, thinning or slimming) and may be manufactured in an efficient process.

According to example embodiments, a semiconductor package may be made slimmer and a heat dissipation characteristic may be improved using hybrid-bonding without a connection bump. In addition, from the viewpoint of a manufacturing process, the use of a carrier substrate for grinding may be avoided by grinding after stacking/bonding of the semiconductor chips. Also, occurrence of warpage during the stacking/bonding process may be minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor package, the method comprising:

providing a substrate including a plurality of basic structures, each of the plurality of basic structures having a first pad on a lower surface thereof, and a second pad on an upper surface thereof;

stacking a plurality of first semiconductor chips on the substrate, each of the plurality of first semiconductor chips having:

a first connection pad directly bonded to the second pad, and a first through-electrode inside each of the plurality of first semiconductor chips, the first through-electrode being electrically connected to the first connection pad;

after stacking the plurality of first semiconductor chips, grinding the plurality of first semiconductor chips to form a ground surface in each of the plurality of first semiconductor chips, the first through-electrode having a tip protruding above the ground surface of each of the plurality of first semiconductor chips;

forming a first upper insulating layer on the plurality of first semiconductor chips to cover the protruding tip of the first through-electrode;

grinding the first upper insulating layer to expose an upper surface of the first through-electrode, such that an upper surface of the first insulating layer is substantially coplanar with the upper surface of the first through-electrode;

forming a second upper insulation layer on the first upper insulation layer and a first bonding pad connected to the first through-electrode, an upper surface of the second upper insulating layer being substantially coplanar with an upper surface of the first bonding pad;

stacking a plurality of second semiconductor chips on the plurality of first semiconductor chips, respectively, each of the plurality of second semiconductor chips having a second connection pad directly bonded to the first bonding pad and a second lower insulation layer directly bonded to the second upper insulation layer;

forming a molding member surrounding the stacked first and second semiconductor chips on the substrate; and after forming the molding member, cutting the substrate to obtain a plurality of semiconductor packages, each of the plurality of semiconductor packages having a basic structure and the stacked first and second semiconductor chips on the basic structure, and each of the plurality of semiconductor packages including a dummy insulation portion having a side surface that is coplanar with a side surface of the molding member.

2. The method of claim 1, wherein the substrate further includes a base insulation layer on an upper surface thereof, and the base insulation layer has an upper surface being substantially coplanar with an upper surface of the second pad.

3. The method of claim 2, wherein each of the plurality of first semiconductor chips further includes a first lower insulation layer having a lower surface being substantially coplanar with a lower surface of the first connection pad, and
wherein stacking the plurality of first semiconductor chips comprises directly bonding the first lower insulation layer to the base insulation layer.

4. The method of claim 1, wherein:
the first upper insulating layer has a first extension portion extending onto the substrate around the plurality of first semiconductor chips, and
the second upper insulating layer has a second extension portion extending onto the first extension portion of the first upper insulating layer, the second extension portion vertically overlapping the first extension portion.

5. The method of claim 1, further comprising forming a resin portion between the plurality of first semiconductor chips on the substrate between stacking the plurality of first semiconductor chips and grinding the plurality of first semiconductor chips.

6. The method of claim 5, wherein grinding the plurality of first semiconductor chips comprises grinding the resin portion.

7. The method of claim 6, wherein the first upper insulating layer has a first extension portion extending onto the ground resin portion around the plurality of first semiconductor chips, and the second upper insulating layer has a second extension portion extending onto the first extension portion of the first upper insulating layer.

8. The method of claim 7, wherein the molding member is formed on the second extension portion of the second upper insulating layer, before cutting the substrate.

9. The method of claim 1, wherein the plurality of second semiconductor chips further includes a second through-electrode electrically connected to the second connection pad, and
the method further comprises:
after stacking the plurality of second semiconductor chips, grinding the plurality of second semiconductor chips to form a ground surface in each of the plurality of second semiconductor chips, the second through-electrode having a tip protruding above the ground surface of each of the plurality of second semiconductor chips;

forming a third upper insulating layer on the plurality of second semiconductor chip to cover the protruding tip of the second through-electrode;
grinding the third upper insulating layer to expose an upper surface of the second through-electrode;
forming a fourth upper insulation layer on the third upper insulation layer and a second bonding pad connected to the second through-electrode, an upper surface of the fourth upper insulating layer being substantially coplanar with an upper surface of the second bonding pad; and
stacking a plurality of third semiconductor chips on the plurality of second semiconductor chips, respectively, each of the plurality of third semiconductor chips having a third connection pad directly bonded to the second bonding pad, and a third lower insulation layer directly bonded to the second upper insulation layer.

10. A method of manufacturing a semiconductor package, the method comprising:
providing a substrate including a plurality of basic structures, each of the plurality of basic structures having a first pad on a lower surface thereof, a second pad on an upper surface thereof, and a base insulation layer on the upper surface thereof, the base insulation layer having an upper surface being substantially coplanar with an upper surface of the second pad;
stacking a plurality of first semiconductor chips on the substrate, the plurality of first semiconductor chips having:
a first connection pad directly bonded to the second pad,
a first through-electrode inside each of the plurality of first semiconductor chips and electrically connected to the first connection pad,
first lower insulation layer directly bonded to the base insulation layer;
after stacking the plurality of first semiconductor chips, grinding the plurality of first semiconductor chips to reduce a thickness thereof, such that the first through-electrode has a tip protruding above the plurality of first semiconductor chips;
forming a first upper insulating layer on the plurality of first semiconductor chips, such that the tip of the first through-electrode is completely covered;
grinding the first upper insulating layer, such that the tip of the first through-electrode is removed and an upper surface of the first insulating layer is coplanar with the upper surface of the first through-electrode;
stacking a plurality of second semiconductor chips on the plurality of first semiconductor chips, respectively;
forming a molding member surrounding the stacked first and second semiconductor chips on the substrate; and
cutting the substrate to obtain a plurality of semiconductor packages, such that each of the plurality of semiconductor packages includes a dummy insulation portion having a side surface that is coplanar with a side surface of the molding member.

11. The method of claim 10, wherein each of the plurality of basic structures has a semiconductor chip.

12. The method of claim 10, further comprising forming a resin portion between the plurality of first semiconductor chips on the substrate between stacking the plurality of first semiconductor chips and grinding the plurality of first semiconductor chips.

* * * * *